(12) United States Patent  
McAdam et al.

(10) Patent No.: US 11,887,924 B2
(45) Date of Patent: Jan. 30, 2024

(54) CHIP SCALE PACKAGE

(71) Applicant: Cirrus Logic International Semiconductor Ltd., Edinburgh (GB)

(72) Inventors: Craig McAdam, Edinburgh (GB); Jonathan Taylor, London (GB); Douglas Macfarlane, Edinburgh (GB); John Kerr, Edinburgh (GB); James Munger, Austin, TX (US); John Pavelka, Austin, TX (US); Steven A. Atherton, Austin, TX (US)

(73) Assignee: Cirrus Logic Inc., Austin, TX (US)

( * ) Notice: Subject to any disclaimer, the term of this patent is extended or adjusted under 35 U.S.C. 154(b) by 0 days.

(21) Appl. No.: 17/993,638

(22) Filed: Nov. 23, 2022

(65) Prior Publication Data

US 2023/0088252 A1    Mar. 23, 2023

Related U.S. Application Data

(63) Continuation of application No. 17/245,259, filed on Apr. 30, 2021, now Pat. No. 11,562,952.

(60) Provisional application No. 63/143,233, filed on Jan. 29, 2021.

(51) Int. Cl.
*H01L 23/498* (2006.01)
*H01L 23/00* (2006.01)

(52) U.S. Cl.
CPC .. *H01L 23/49838* (2013.01); *H01L 23/49822* (2013.01); *H01L 24/13* (2013.01); *H01L 2224/16227* (2013.01)

(58) Field of Classification Search
CPC ............... H01L 23/49822; H01L 23/49838
See application file for complete search history.

(56) References Cited

U.S. PATENT DOCUMENTS

| | | | |
|---|---|---|---|
| 6,407,344 B1 | 6/2002 | Horiuchi et al. | |
| 7,838,778 B1 | 11/2010 | Hasko et al. | |
| 2002/0038724 A1 | 4/2002 | Park et al. | |
| 2002/0100955 A1* | 8/2002 | Potter | H01L 24/12 257/E23.07 |
| 2003/0183419 A1 | 10/2003 | Miller et al. | |
| 2004/0046264 A1* | 3/2004 | Ho | H01L 21/563 257/E21.503 |
| 2004/0164427 A1 | 8/2004 | Seaman et al. | |
| 2004/0227233 A1 | 11/2004 | Hussa | |

(Continued)

FOREIGN PATENT DOCUMENTS

| | | |
|---|---|---|
| DE | 10138958 A1 | 5/2002 |
| EP | 1006577 A2 | 6/2000 |

(Continued)

OTHER PUBLICATIONS

Combined Search and Examination Report under Sections 17 and 18(3), UKIPO, Application No. GB2106236.9, dated Sep. 22, 2021.

(Continued)

*Primary Examiner* — William A Harriston
(74) *Attorney, Agent, or Firm* — Jackson Walker L.L.P

(57) ABSTRACT

The present disclosure relates to a chip scale package (CSP) comprising: a first set of CSP contact balls or bumps; a second set of CSP contact balls or bumps; and a channel routing region, the channel routing region being devoid of any CSP contact balls or bumps.

11 Claims, 23 Drawing Sheets

(56) References Cited

U.S. PATENT DOCUMENTS

| | | | |
|---|---|---|---|
| 2005/0186708 A1* | 8/2005 | Yamada | H01L 24/12 257/E23.021 |
| 2009/0065935 A1 | 3/2009 | Bazata | |
| 2011/0001231 A1 | 1/2011 | Lovskog | |
| 2013/0113097 A1 | 5/2013 | Yu et al. | |
| 2013/0214409 A1 | 8/2013 | Pagaila et al. | |
| 2014/0060912 A1 | 3/2014 | Kanzaki | |

FOREIGN PATENT DOCUMENTS

| | | |
|---|---|---|
| EP | 1075026 A2 | 2/2001 |
| TW | 201240042 A | 10/2012 |
| TW | 201614789 A | 4/2016 |
| TW | 201832335 A | 4/2016 |
| TW | 201832335 A | 9/2018 |
| TW | 202008532 A | 2/2020 |
| WO | 2009032506 A2 | 5/2009 |

OTHER PUBLICATIONS

International Search Report and Written Opinion of the International Searching Authority, International Application No. PCT/GB2021/052350, mailed Jan. 7, 2022.
Definition of "chip scale package", https://en.wikipedia.org/wiki/Chip-scale_package.

* cited by examiner

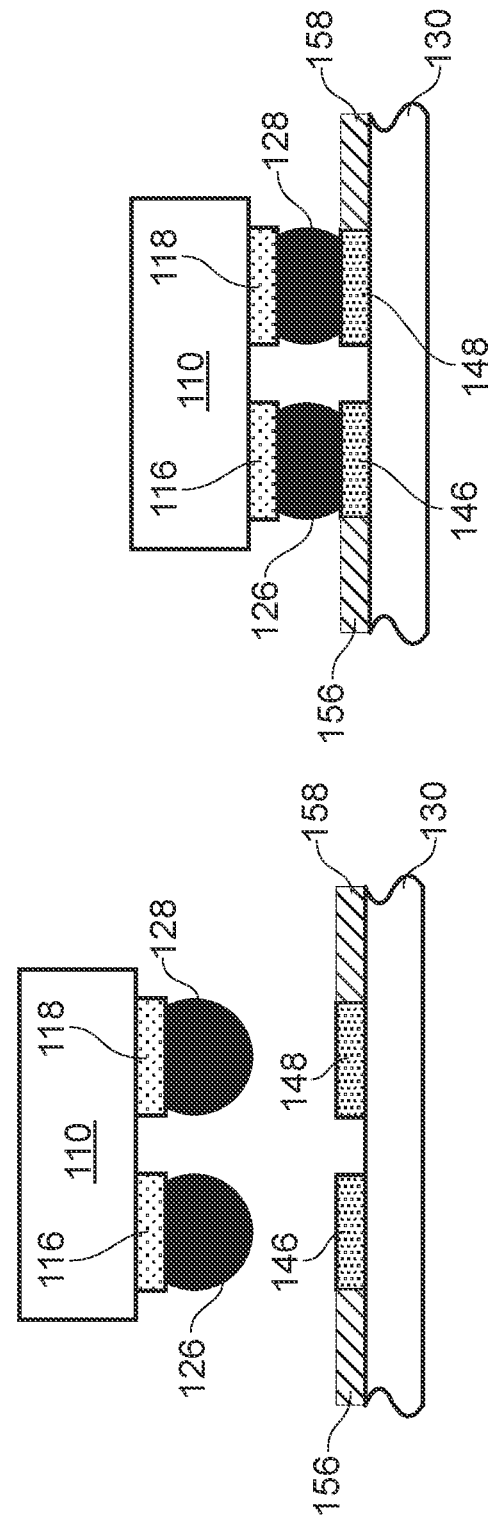

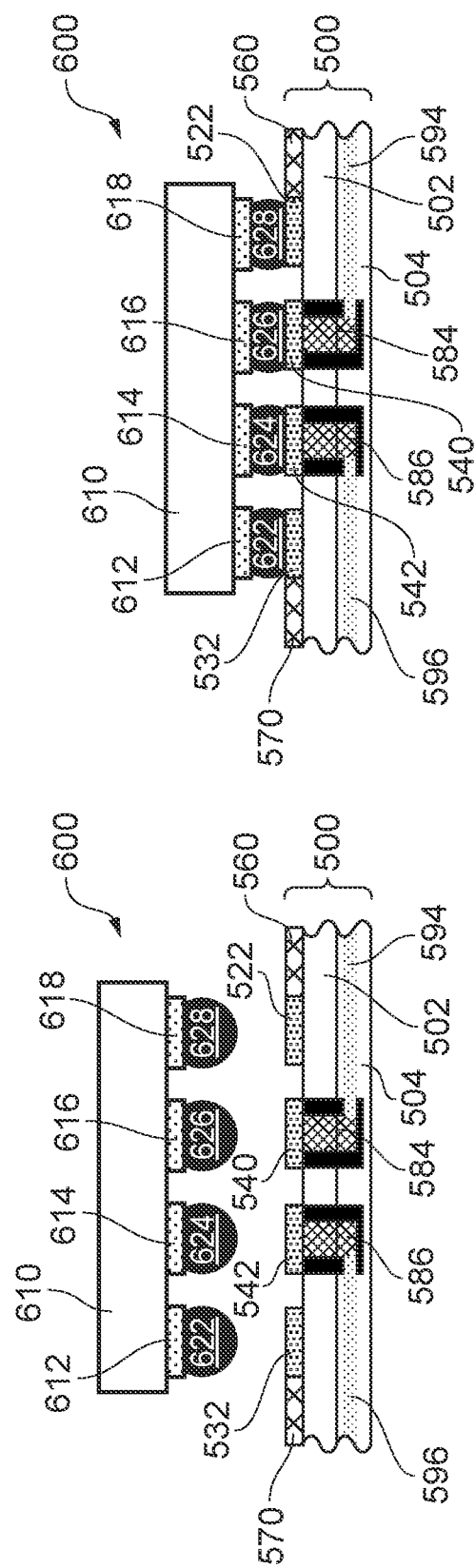

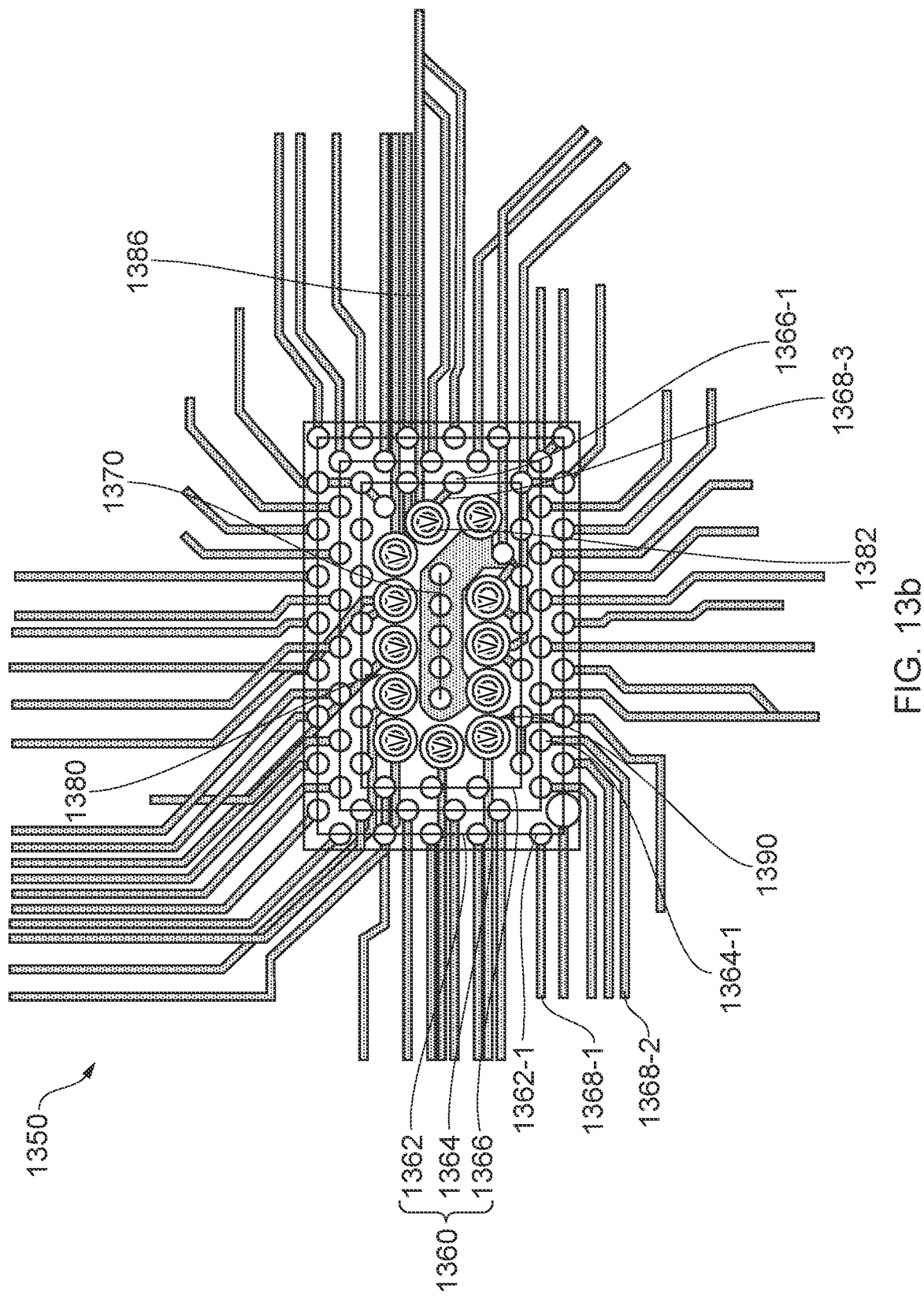

CHIP SCALE PACKAGE

The present disclosure is a continuation of U.S. Non-Provisional patent application Ser. No. 17/245,259, filed Apr. 30, 2021, which is claims priority to U.S. Provisional Patent Application Ser. No. 63/143,233, filed Jan. 29, 2021, each of which is incorporated by reference herein in its entirety.

FIELD OF THE INVENTION

The present disclosure relates to integrated circuit packaging, and in particular to a chip-scale package (CSP) and an associated substrate such as a printed circuit board (PCB).

BACKGROUND

A chip-scale package (CSP) is an integrated circuit (IC) package that is approximately the same size as the semiconductor die of the IC. The CSP is mounted directly on a substrate such as a printed circuit board (PCB), so does not require a housing with bond wires and the like. Contact pads are provided on the underside of the IC die, and balls or bumps of electrically conductive solder are electrically coupled to the IC contact pads.

The CSP can be mounted on and electrically coupled to the substrate by positioning the balls or bumps on the corresponding contact pads of the substrate and applying heat to melt the solder to mechanically and electrically couple the IC contact pads to the corresponding substrate contact pads.

Each contact pad of the substrate is electrically coupled to an electrically conductive signal routing channel or track provided by a metal layer of the substrate, to allow routing of electrical signals to and/or from the IC.

FIG. 1a is a view of the underside of an IC die 110 of a CSP 100 with four IC contact pads 112-118. FIG. 1b is a view of the underside of the IC die 110 of FIG. 1a showing balls 122-128 coupled to the IC contact pads 112-118, and FIG. 1c is a side view of the CSP 100 showing the IC die 110, the IC contact pads 116, 118 and the balls 126, 128. In the example illustrated in FIGS. 1a-1c, the IC die 110 is provided with 2 rows of contact pads, and also 2 columns of contact pads, but in general an IC die may be provided with M rows and N columns of contact pads, where M and N could be equal or not equal depending on the design of the IC die.

FIG. 1d is a side view showing the CSP 100 of FIG. 1c and a single-layer PCB substrate 130 with PCB contact pads 146, 148 coupled to respective conductive signal channels or tracks 156, 158 that are provided in a metal layer that is disposed on a top surface of the PCB substrate 130. FIG. 1e is a side view showing the CSP 100 of FIG. 1d mounted on the PCB substrate 130, with the balls 126, 128 coupled, respectively, to the PCB contact pads 146, 148, such that electrical signals can be conducted to/from the IC die 110 via the signal channels or tracks 156, 158.

As will be appreciated by those of ordinary skill in the art, although not shown in FIGS. 1d and 1e, when the CSP 100 is mounted on the PCB substrate 130, the balls 122, 124 of the CSP 100 are also coupled to respective PCB contact pads, which are in turn coupled to respective signal routing channels or tracks. FIG. 1f is a view from above the PCB substrate 130, showing the PCB contact pads 146, 148 and their associated signal routing channels or tracks 156,158, in the metal layer, as well as additional PCB contact pads 142, 144 for receiving the balls 122, 124, and signal routing channels or tracks 152,154 in the metal layer coupled to the PCB contact pads 142, 144 respectively. As can be seen from FIG. 1f, the PCB contact pads 142-148 lie within the outline or footprint of the IC die 110 when the CSP 100 is mounted on the PCB substrate 130.

The IC contact pads 112-118 and balls/bumps 122-128 are regularly spaced on the underside of the IC die 110. The balls/bumps 122-128 are substantially the same size and shape. The distance between the centres of adjacent balls/bumps is referred to as the pitch. The pitch in the x-direction (e.g. horizontal) and the pitch in the y-direction (e.g. vertical) are typically the same, but may differ. The distance between the perimeters of adjacent balls/bumps is referred to as the clearance. The clearance in the x-direction (e.g. horizontal) and the clearance in the y-direction (e.g. vertical) are typically the same, but may differ. The concepts of pitch and clearance are illustrated in FIG. 2.

The pitch and clearance are dictated by the way in which the balls/bumps are formed. By minimising the pitch and clearance (within applicable design rules) the footprint of the CSP can be minimised, thus minimising the area occupied by the CSP on a PCB or other substrate.

For the 2×2 IC contact arrangement shown in FIGS. 1a-1f, providing signal routing channels on a substrate with a single metal layer is straightforward, as each PCB contact pad 142-148 (corresponding to a respective IC contact pad 112-118) can be coupled to a respective signal routing channel 152-158 of the metal layer, as shown in FIG. 1f.

However, as the number of IC contacts increases, providing signal routing channels for signals to and/or from the IC contacts on a substrate with a single metal layer becomes more challenging, due to the pitch and clearance of the CSP balls/bumps.

FIG. 3a is a view from above, showing a PCB substrate 300 having 3×3 arrangement of PCB contact pads 312-328 for receiving and electrically coupling to a corresponding 3×3 arrangement of balls/bumps on a CSP.

As can be seen, providing signal routing channels 332-346 in the metal layer of a single-layer PCB for the 8 PCB contact pads in an outer "ring" or loop 350 (i.e. the perimeter set of contact pads 312-326) in this arrangement is relatively straightforward, as the signal routing channels 332-346 can be configured to extend outwardly of their respective PCB contact pads 312-326 without coming into contact with each other or with any other PCB contact pad.

However, providing a signal routing channel on the metal layer of a single-layer PCB for the central PCB contact pad 328 in the 3×3 arrangement is more difficult.

As shown in FIG. 3b, any signal routing channel or track for the central PCB contact pad 328 on the metal layer must be narrower than the clearance between adjacent balls/bumps of the CSP, to stay within permitted design rules and/or to avoid short circuits between the central PCB contact 328 and the two PCB contact pads on either side of the signal routing channel for the central PCB contact pad when the CSP is installed. For example, a signal routing channel or track 360 that runs between PCB contact pads 324 and 326 in the example illustrated in FIG. 3b must be narrower than the clearance between CSP balls/bumps 372 and 374 to avoid design rule violations and/or avoid short circuits between the central PCB contact 328 and the PCB contact pads 326 and 328.

This requires precise positioning of the signal routing channel, PCB contact pad and balls/bumps of the CSP, and tight tolerances in the dimensions of the PCB contact pad and balls/bumps of the CSP.

In some cases it may not be possible to provide a signal routing channel between two PCB contact pads within applicable design rules, e.g. because the combination of a specified minimum width for the signal routing channel and the gaps required between the signal routing channel and unrelated metal of the PCB metal layer width is greater than the clearance between adjacent balls/bumps of the CSP.

One way of avoiding this issue is to use a multilayer substrate (PCB) with a via on pad (VoP) for the central PCB contact, as shown in FIGS. 4a-4c.

FIG. 4a is a view from above, showing a multilayer PCB 400 having a 3×3 arrangement of PCB contact pads 412-428 configured to receive balls/bumps of a CSP. As in the arrangement of FIG. 3a, the 8 PCB contact pads 412-426 of an outer ring or loop 450 are again each provided with a respective signal routing channel or track 432-446 on a first metal layer of the multilayer PCB 400.

A via 430 is provided directly beneath the central PCB contact pad 428, with a conductive portion that electrically connects the central PCB contact pad 428 to a second metal layer of the multilayer PCB 400. The conductive portion of the via 430 is surrounded by an insulating portion to prevent any other electrical coupling between the first metal layer of the PCB and the central PCB pad and/or the second metal layer.

A signal routing channel or track 448 in the second metal layer of the PCB 400 is coupled to the conductive portion of the via 430 so as to provide a signal routing channel 448 for the central PCB contact pad 428. (Note that the signal routing channel need not extend in a direction perpendicular to IC outline as shown in the example of FIG. 4a, but could extend in any direction in the second metal layer that does not conflict with another signal routing channel in the second metal layer).

FIG. 4b is a cross-sectional view showing the multilayer PCB 400 and a CSP 480 comprising an IC die 460 having a 3×3 arrangement of IC contact pads and associated balls/bumps corresponding to the 3×3 arrangement of PCB contact pads of the multilayer PCB 400. (It will be noted that only three IC contact pads 462, 464, 466 and their corresponding balls/bumps 472, 474, 476 are shown in the cross-sectional view of FIG. 4b).

As can be seen in FIG. 4b, in this example the multilayer PCB 400 comprises a first (upper) layer 402, on which the first metal layer is disposed. The signal routing channels or tracks 432-446 are provided in the first metal layer, and are coupled to the respective PCB contact pads 412-426. The second metal layer is provided in a second (lower) layer 404 of the multilayer PCB 400, and provides the signal routing channel or track 448 that is coupled, by conductive portion 432 of the via 430, to the central PCB contact pad 428. As can be seen, the conductive portion 432 of the via 430 is surrounded by an insulating portion 434 to prevent any other electrical coupling between the first metal layer of the PCB and the central PCB pad 428 and/or the second metal layer.

FIG. 4c is a cross-sectional view showing the CSP 480 mounted on the multilayer PCB 400. As can be seen, when the CSP 480 is mounted on the multilayer PCB a central ball/bump 474 is coupled to the central PCB contact pad 428, and thus to the signal routing channel or track 448 in the second layer 404 of the PCB 400, whilst balls/bumps 472, 476 belonging to an outer or perimeter ring, loop or set of balls/bumps of the CSP 480 are coupled to respective PCB contact pads 426, 418 of the PCB 400. (It will be appreciated that although only three IC contact pads 462, 464, 466 and their corresponding balls/bumps 472, 474, 476 are shown in the cross-sectional view of FIG. 4c, all 8 of PCB contact pads 412-426 of the outer ring or loop 450 will be coupled to a respective ball/bump of the CSP 480 when the CSP 480 is mounted on the PCB 400).

This approach can be used to facilitate providing signal routing channels on a PCB for CSPs with multiple concentric "rings", loops or sets of balls/bumps (where a central "ring", loop or set could comprise a single ball/bump, as in the 3×3 arrangement of FIGS. 4a-4c).

For example, FIG. 5 shows a PCB 500 having a 4×4 arrangement of PCB contact pads for receiving and electrically coupling to a corresponding 4×4 arrangement of balls/bumps on a CSP.

As can be seen, this arrangement includes 4 VoPs 580-588 and associated signal routing channels or tracks 590-598 in a second metal layer of the multilayer PCB 500 for a first (central, in this example) ring/loop/set 515 of PCB contact pads 536-542, and 12 contact pads 512-534 and associated signal routing channels or tracks 550-572 in the first metal layer of the PCB 500 for a second (outer/perimeter in this example) ring/loop/set 525 of PCB contact pads.

FIG. 6a is a cross-sectional view showing the multilayer PCB 500 of FIG. 5 and a CSP 600 comprising an IC die 610 having a 4×4 arrangement of IC contact pads and associated balls/bumps corresponding to the 4×4 arrangement of PCB contact pads of the multilayer PCB 500. (It will be noted that only four IC contact pads 612-618 and their corresponding balls/bumps 622-628 are shown in the cross-sectional view of FIG. 6a).

As can be seen in FIG. 6a, in this example the multilayer PCB 500 comprises a first (upper) layer 502, on which the first metal layer is disposed. The signal routing channels or tracks 550-572 are provided in the first metal layer, and are coupled to the respective PCB contact pads 512-534 of the second ring/loop/set 525. The second metal layer is provided in a second (lower) layer 504 of the PCB 500, and provides the signal routing channel or tracks 590-598 that are coupled, by the respective vias 580-588, to the PCB contact pads 536-542 of the first ring/loop/set 515.

FIG. 6b is a cross-sectional view showing the CSP 600 mounted on the multilayer PCB 500. As can be seen, when the CSP 600 is mounted on the multilayer PCB 500, balls/bumps 624, 626 belonging to a central ring, loop or set of the CSP 600 are coupled to the corresponding contact pads 542, 540 of the first (central) ring/loop/set 515 of the PCB 500, and thus to the signal routing channels or tracks 596, 594 in the second layer 504 of the PCB 500, whilst balls/bumps 622, 628 belonging to an outer or perimeter ring, loop or set of balls/bumps of the CSP 600 are coupled to corresponding PCB contact pads 532, 520 of the second (outer/perimeter ring/loop/set 525) of the PCB 500. (It will be appreciated that although only four IC contact pads 532, 542, 540, 522 and their corresponding balls/bumps 622, 624, 626, 628 are shown in the cross-sectional view of FIG. 6b, all 12 of the PCB contact pads 512-534 of the outer ring or loop 525 will be coupled to a respective ball/bump of the CSP 600 when the CSP 600 is mounted on the PCB 500).

As another example, FIG. 7a shows a multilayer PCB 700 having a 6×5 arrangement of PCB contact pads for receiving and electrically coupling to a corresponding 6×5 arrangement of balls/bumps on a CSP.

As can be seen, this arrangement includes 2 VoPs 712, 714 coupled to associated signal routing channels or tracks 722, 724 provided in a third metal layer of the PCB 700 for a first (central) "ring"/loop/set 710 of two PCB contact pads, ten VoPs (e.g. VoPs 732, 734) coupled to associated signal routing channels or tracks (e.g. 742, 744) provided in a second metal layer of the PCB 700 for a second (intermediate) ring/loop/set 730 of PCB contact pads, and 16 contact pads (e.g. 752, 754) coupled to associated signal routing channels or tracks (e.g. 762, 764) in a first metal layer of the PCB 700 for a third (outer/perimeter) ring/loop/set 750 of PCB contact pads.

FIG. 7b is a cross-sectional view showing a CSP 770 mounted on the multilayer PCB 700. As can be seen, the PCB 700 comprises first, second and third metal layers 702, 704, 706.

When the CSP 770 is mounted on the multilayer PCB 700, a ball/bump 793 belonging to a central ring, loop or set of the CSP 770 is coupled to the corresponding VoP 714 of the first (central) ring/loop/set 710 of the PCB 700, and thus to the associated signal routing channel or track 724 in the third metal layer 706 of the PCB 700.

Balls/bumps 792, 794 belonging to a second, intermediate, ring, loop or set of balls/bumps of the CSP 770 are coupled to corresponding VoPs 734, 732 of the second (intermediate) ring/loop/set 730 of PCB contact pads of the PCB 700, and thus to the associated signal routing channels or tracks 742, 744 in the second metal layer 704 of the PCB 700.

Balls/bumps 791, 795 belonging to an outer or perimeter ring, loop or set of balls/bumps of the CSP 770 are coupled to corresponding PCB contact pads 752, 754 of the third (outer/perimeter) ring/loop/set 750 of the PCB 700 and thus to the associated signal routing channels or tracks 762, 764 in the first metal layer 702 of the PCB 700.

(It will be appreciated that although only five IC contact pads 781-785 and their corresponding balls/bumps 791-795 are shown in the cross-sectional view of FIG. 7b, all of the PCB contact pads/VoPs of each ring/loop/set 710, 730, 750 will be coupled to a respective ball/bump of the CSP 770 when the CSP 770 is mounted on the PCB 700).

In general, the number of PCB layers required to provide a signal routing channel for each PCB contact pad is equal to the number of concentric rings, loops or sets of PCB contact pads.

The use of VoPs and multilayer PCBs to provide signal routing channels in this way is effective, but the high density multilayer "Via PCB" technology required is costly in terms of materials, tooling and manufacturing.

Alternative approaches to avoid using "Via PCB" technology involve the use of different package types for the IC, e.g. QFN (Quad-Flat No-leads) or BGA (Ball Grid Array). However, the use of such package types can increase the cost of a finished product, can introduce additional device costs, and can lead to additional parasitic inductances, resistances and/or capacitances due to the additional signal paths between the package terminals and the IC contained within the package. Additionally, these different package types increase the footprint of the package on the PCB (i.e. the area of the PCB occupied by the package) in comparison to that of a CSP.

SUMMARY

According to a first aspect, the invention provides a chip scale package (CSP) comprising:
 a first set of CSP contact balls or bumps;
 a second set of CSP contact balls or bumps; and
 a channel routing region, the channel routing region being devoid of any CSP contact balls or bumps.

The channel routing region may be intermediate the first and second sets of CSP contact balls or bumps.

The first set of CSP contact balls or bumps may comprise a discontinuous first ring or loop of CSP contact balls or bumps, and the channel routing region may be provided, at least in part, by a discontinuity in the first ring or loop.

The second set of CSP contact balls or bumps may comprise a second ring or loop of CSP contact balls or bumps.

The second ring or loop of CSP contact balls or bumps may be discontinuous, and the channel routing region may be provided, at least in part, by a discontinuity in the second ring or loop.

The CSP contact balls or bumps of the second set may be offset with respect to the CSP contact balls or bumps of the first set.

A pitch of the CSP contact balls or bumps of the first set or the second set may be non-uniform.

According to a second aspect, the invention provides a substrate arrangement for receiving a CSP according to the first aspect, the substrate arrangement comprising:
 a first set of substrate contact pads configured to receive the first set of CSP contact balls or bumps;
 a second set of substrate contact pads configured to receive the second set of CSP contact balls or bumps; and
 a channel routing region, the channel routing region comprising one or more signal routing channels in a first metal layer of the substrate.

The channel routing region may be intermediate the first and second sets of substrate contact pads.

The substrate may comprise a second metal layer.

The channel routing region may comprise a via configured to electrically couple the first metal layer to the second metal layer.

The via may be coupled at a first end to a substrate contact pad by a signal routing channel in the first metal layer, and at a second end to a signal routing channel in the second metal layer.

According to a third aspect, the invention provides a chip-scale package (CSP) comprising:
 a first discontinuous set of CSP contact balls or bumps disposed in a perimeter region of the CSP; and
 a second set of CSP contact balls or bumps disposed in a second region of the CSP, the second region being within the perimeter region,
 wherein a discontinuity in the first set of CSP contact balls or bumps provides at least part of a channel routing region within an outline or footprint of the CSP.

The second set of CSP contact balls or bumps may be discontinuous, and a discontinuity in the second set of CSP contact balls or bumps may provide at least part of the channel routing region.

According to a fourth aspect, the invention provides a PCB arrangement for receiving a CSP according to the third aspect, the PCB arrangement comprising:
 a first discontinuous set of PCB contact pads disposed in a perimeter region of the PCB arrangement and configured to receive the first set of CSP contact balls or bumps;
 a second set of PCB contact pads disposed in a second region of the PCB arrangement and configured to receive the second set of CSP contact balls or bumps, the second region being within the perimeter region,
 wherein a discontinuity in the first set of PCB contact pads provides at least part of a channel routing region within an outline or footprint of the CSP, the channel routing region comprising at least one signal routing channel.

The second set of PCB contact pads may be discontinuous, and a discontinuity in the second set of PCB contact pads may provide at least part of the channel routing region.

The PCB may comprise a second metal layer.

The channel routing region may comprise a via configured to electrically couple the first metal layer to the second metal layer.

The via may be coupled at a first end to a PCB contact pad by a signal routing channel in the first metal layer, and at a second end to a signal routing channel in the second metal layer.

According to a fifth aspect, the invention provides a module comprising a CSP according to the first aspect and a substrate arrangement according to the second aspect.

According to a sixth aspect, the invention provides a module comprising a CSP according to the third aspect and a substrate arrangement according to the fourth aspect.

BRIEF DESCRIPTION OF THE DRAWINGS

Embodiments of the invention will now be described, strictly by way of example only, with reference to the accompanying drawings, of which:

FIG. 1d is a side view showing the CSP of FIG. 1c and a single-layer PCB substrate;

FIG. 1e is a side view showing the CSP of FIG. 1d mounted on the PCB substrate;

FIG. 3b is an enlarged view of a portion of the PCB substrate of FIG. 3a;

FIG. 6a is a cross-sectional view showing the multilayer PCB of FIG. 5 and a CSP;

FIG. 6b is a cross-sectional view showing the CSP of FIG. 6a mounted on the multilayer PCB of FIG. 6a;

FIG. 7b is a cross-sectional view showing a CSP mounted on the multilayer PCB of FIG. 7a;

FIG. 8b is a schematic representation of the underside of a CSP for use with the PCB of FIG. 8a;

FIG. 9b is a schematic representation of the underside of a CSP for use with the PCB of FIG. 9a;

FIG. 10b is a schematic representation of the underside of a CSP for use with the PCB of FIG. 10a;

FIG. 11b shows contact balls/bumps disposed on the IC contact pads of the IC die of FIG. 11a;

FIG. 12a is a schematic illustration of the underside of a CSP, showing generally circular IC contact pads in an offset arrangement;

FIG. 12b shows contact balls/bumps disposed on the IC contact pads of the CSP of FIG. 12a;

FIG. 13b is a schematic illustration of a PCB arrangement configured to receive the CSP of FIG. 13a;

FIG. 14b is a schematic illustration of a PCB arrangement configured to receive the CSP of FIG. 14a.

DETAILED DESCRIPTION

The present disclosure provides a novel CSP arrangement and a corresponding substrate (e.g. PCB) arrangement that can obviate the need for costly high-density "Via PCB" technology, by providing a channel routing region in the CSP to permit the provision of signal routing channels or tracks on the PCB within an outline or footprint of the CSP.

In contrast to known approaches, in which a standard IC package (e.g. a CSP) is used and the substrate on which it is mounted must be designed or selected for compatibility with the IC package, the present disclosure provides an approach in which the design of the IC package is governed or guided by the substrate on which the IC package is to be mounted. Altering the design focus in this way permits the use of simpler and cheaper manufacturing processes for the substrate, and hence a less costly substrate, which can give rise to a reduction in the cost of a product incorporating the CSP, in comparison to known approaches.

Figure 8A:
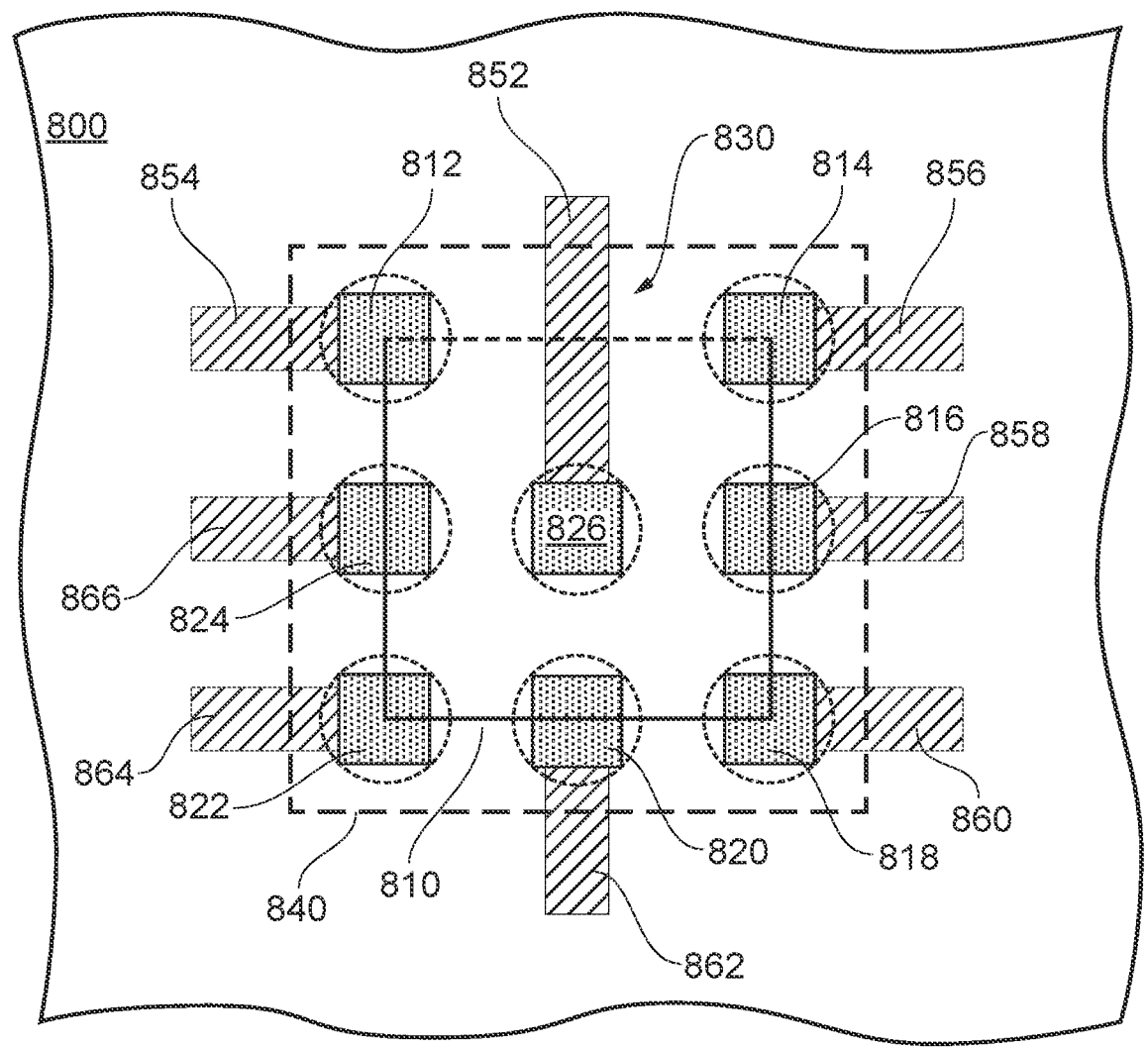
FIG. 8a is a schematic representation of a single-layer PCB having an arrangement of PCB contact pads.

FIG. 8a illustrates the general principle of the present disclosure, and shows a single-layer PCB 800 having an arrangement of PCB contact pads 812-826 for receiving and electrically coupling to a corresponding arrangement of balls/bumps on a CSP.

Figure 1C:
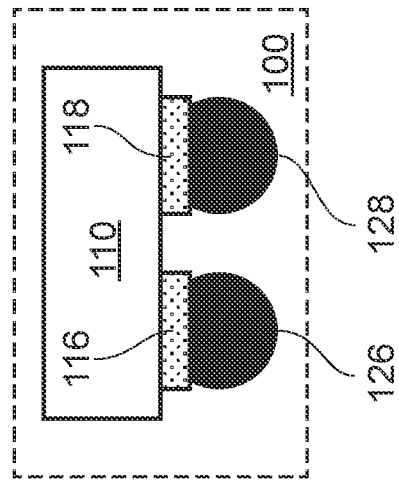
FIG. 1c is a side view of a CSP 100.
Figure 1B:
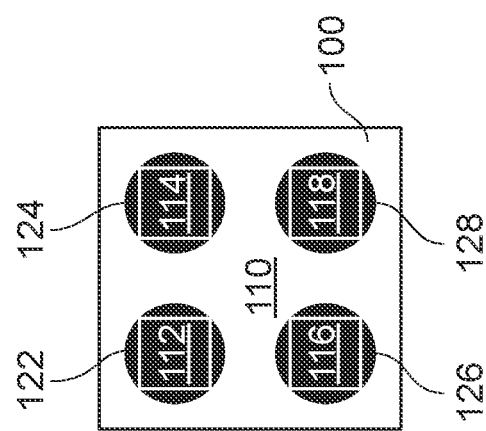
FIG. 1b is a view of the underside of the IC die of FIG. 1a showing balls coupled to the IC contact pads.
Figure 1A:
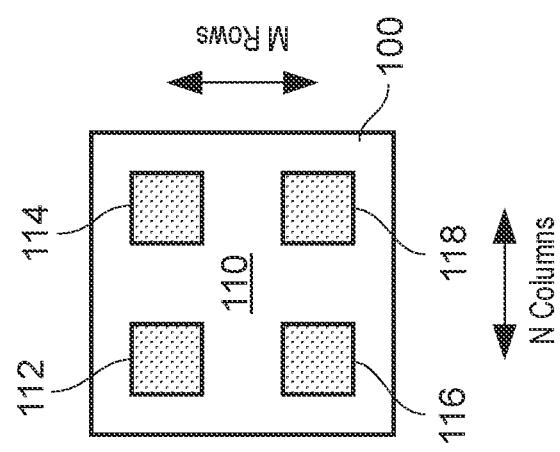
FIG. 1a is a schematic diagram illustrating the underside of an IC die of a CSP showing IC contact pads of the IC die.
Figure 1F:
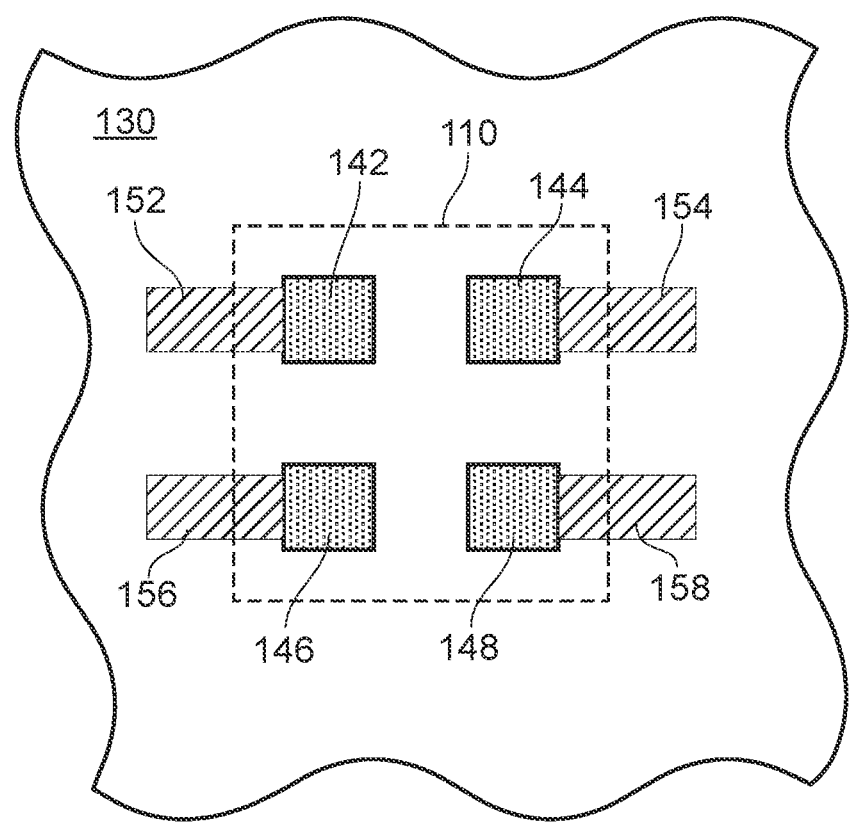
FIG. 1f is a view from above the PCB substrate of FIGS. 1d and 1e.
Figure 2:
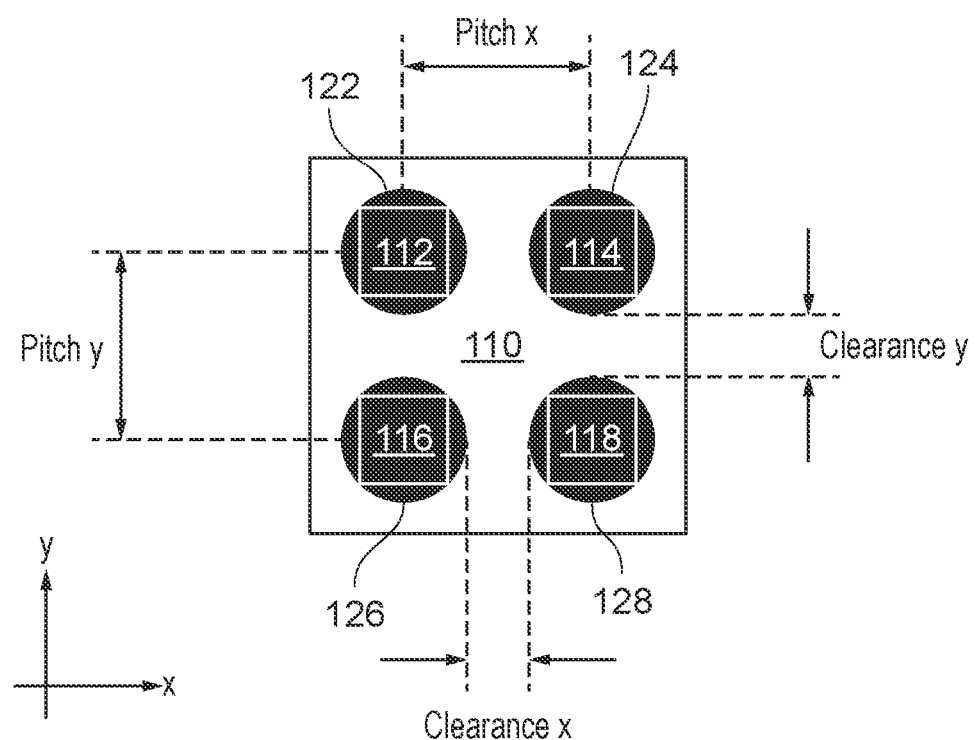
FIG. 2 is a schematic diagram illustrating the concepts of pitch and clearance of the balls of a CSP.
Figure 3A:
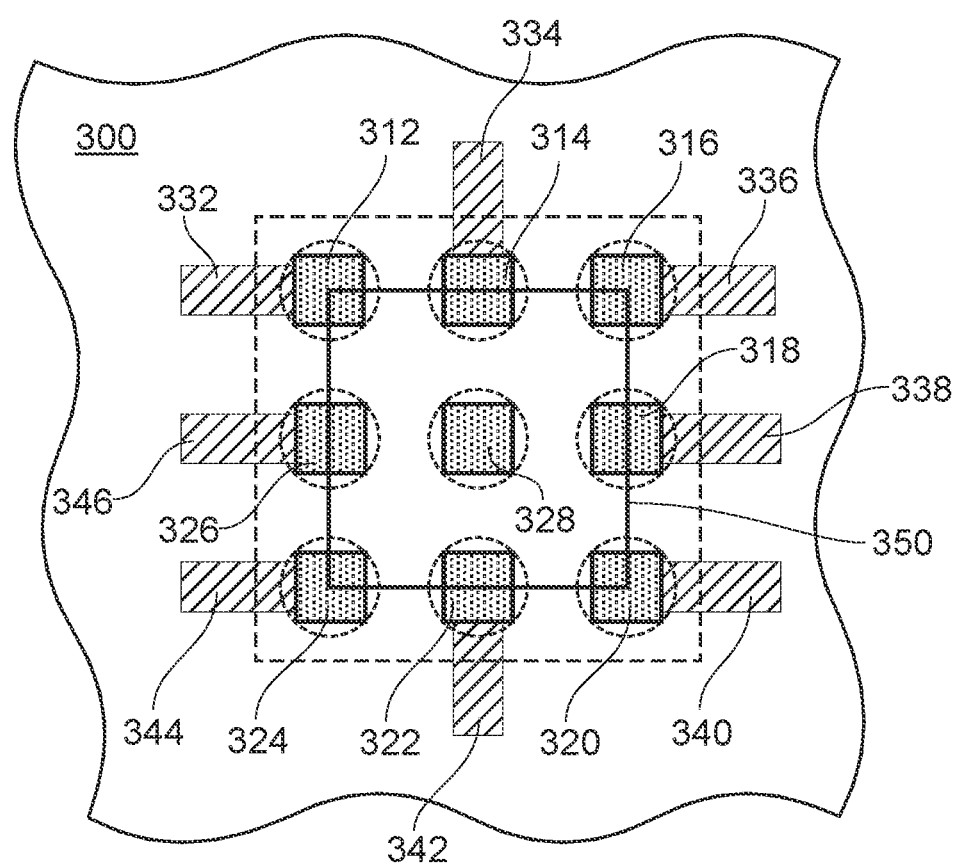
FIG. 3a is a schematic view from above, showing a PCB substrate.
Figure 3B:
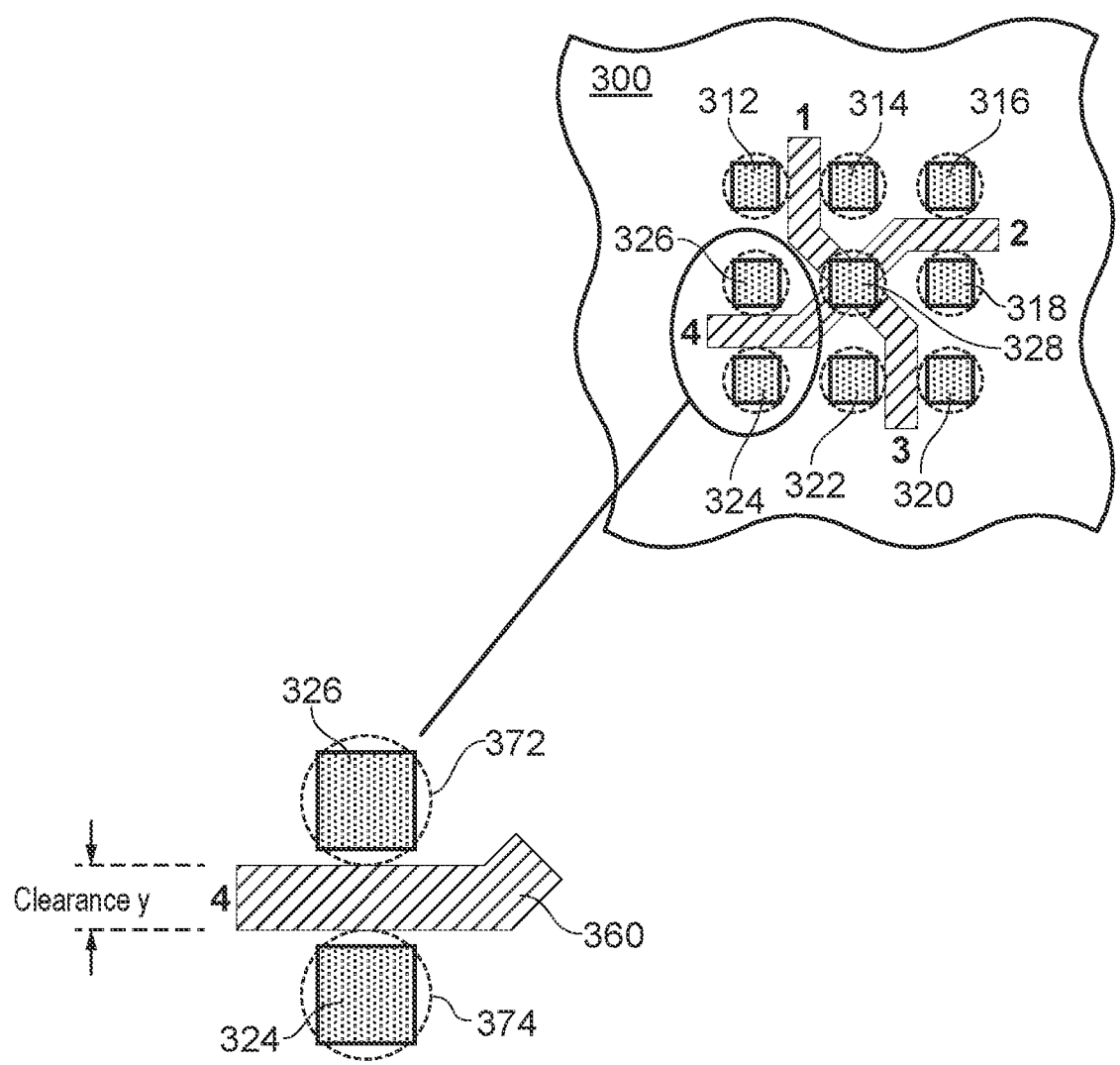

In comparison to the 3×3 arrangement of FIG. 3a, in the arrangement of FIG. 8a one of the PCB contact pads has been removed from the outer/perimeter ring/loop/set of PCB contact pads, to create a discontinuous outer/perimeter "ring", loop or set 810 of seven PCB contact pads 812-824 and a single inner "ring", loop or set of one PCB contact pad 826.

The discontinuity in the outer/perimeter "ring"/loop/set 810 of contact pads provides a channel routing region 830, within the outline or footprint 840 of the CSP, for a signal routing channel or track 852 (provided in the metal layer of the PCB 800) from the inner/central PCB contact pad 826. The pitch of the remaining PCB contact pads 812-824 is the same as in the FIG. 3a arrangement, and each of the remaining PCB contact pads 812-824 is coupled to a respective signal routing channel or track 854-866 provided in the metal layer of the PCB.

In this example the width of the channel routing region is equal to 2p−d, where p is the pitch of the PCB contact pads 812-824 and d is the diameter of the PCB contact pads. Similarly, in this example the width of the gap between PCB contact pads on either side of the discontinuity in the outer ring or loop is equal to 2p−d.

Figure 4C:
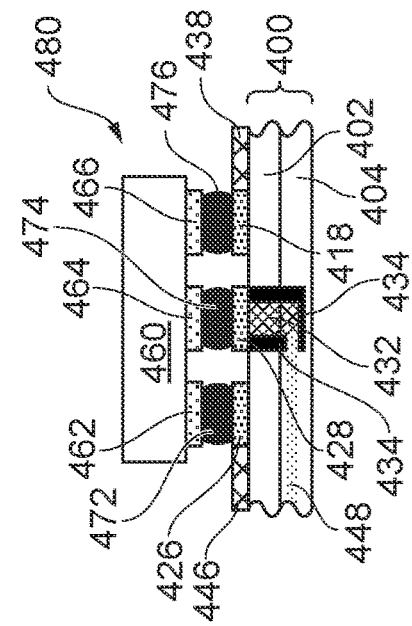
FIG. 4c is a cross-sectional view showing the CSP of FIG. 4b mounted on the multilayer PCB of FIGS. 4a and 4b.
Figure 4A:
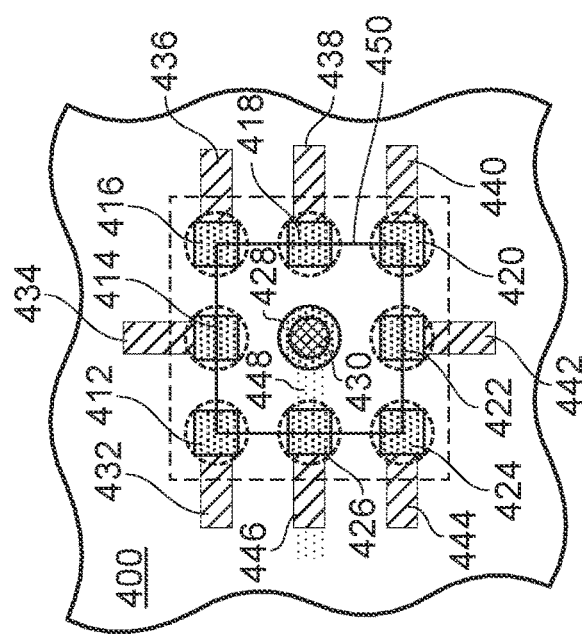
FIG. 4a is a view from above, showing a multilayer PCB having a 3×3 arrangement of PCB contact pads.
Figure 4B:
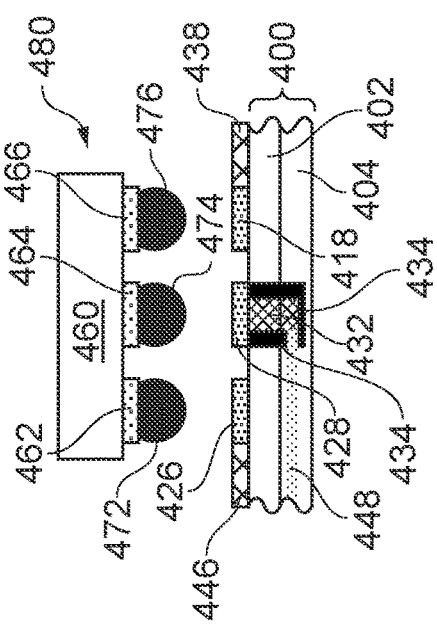
FIG. 4b is a cross-sectional view showing the multilayer PCB of FIG. 4a and a CSP.
Figure 5:
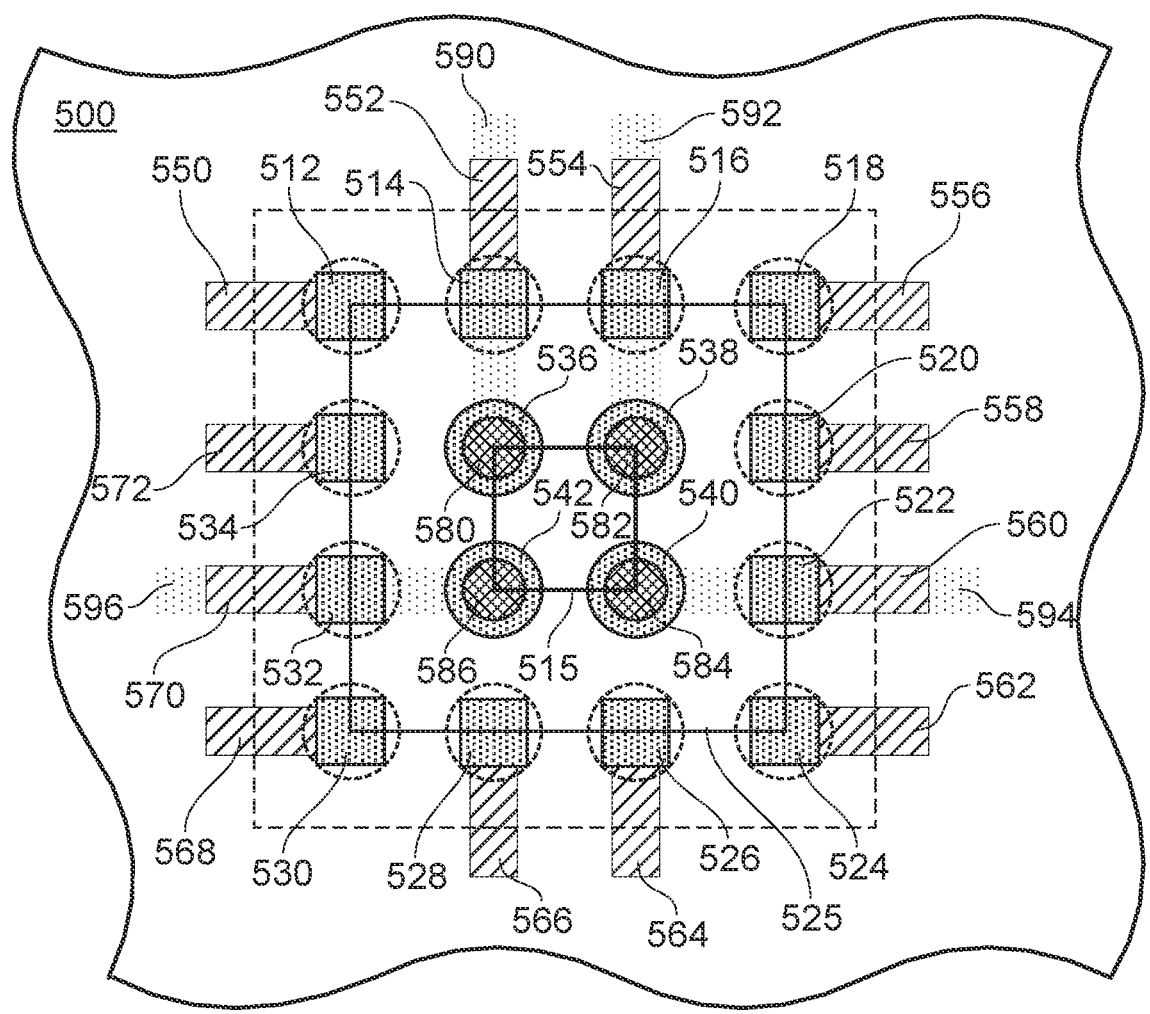
FIG. 5 is a schematic representation of a PCB having a 4×4 arrangement of PCB contact pads.
Figure 8B:
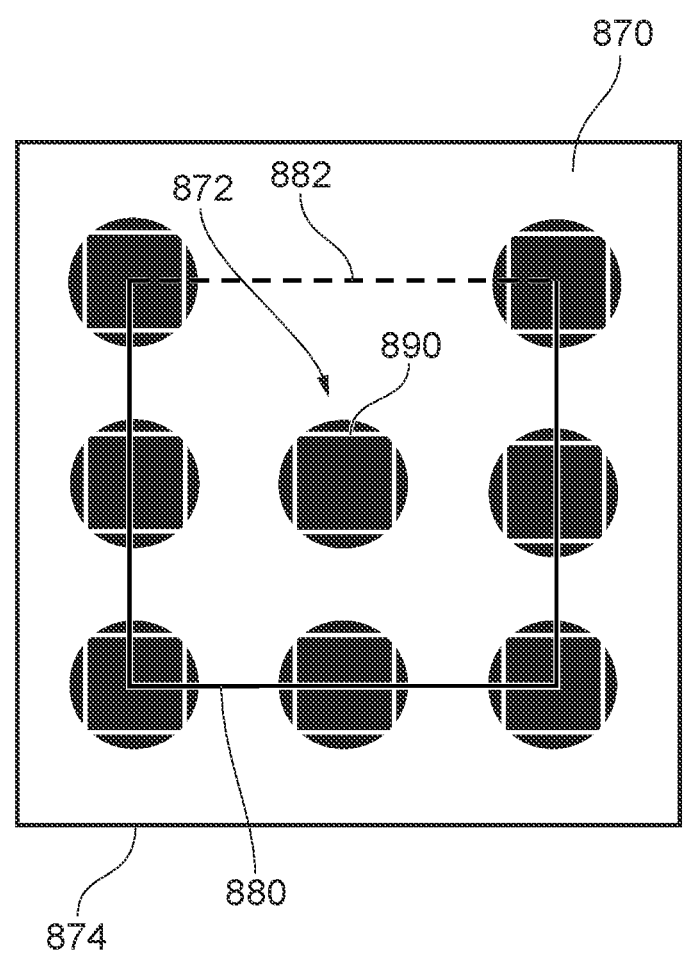

FIG. 8b is a view of the underside of a CSP 870 corresponding to (i.e. for use with) the PCB 800 of FIG. 8a. The CSP 870 comprises eight IC contact pads and associated balls/bumps, positioned to align with the PCB contact pads 812-824. In comparison with the arrangement shown in FIG. 4a, one contact pad and its associated ball/bump have been removed in the CSP 870, such that the CSP 870 has a discontinuous outer/perimeter ring/loop/set 880 of IC contacts and associated balls/bumps, and an inner/central "ring"/loop/set of (in this example one) IC contact, the discontinuity 882 in the perimeter/outer ring/loop/set 880 providing a channel routing region 872 within the outline/footprint 874 of the CSP 870 for a signal routing channel/track on the PCB 800 for the inner/central ball/bump. Note that the pitch and clearance of the balls/bumps is the same as in the FIG. 4a-4c arrangement.

Thus, all of the signal routing channels for the PCB contact pads corresponding to the IC contact pads of the CSP can be provided on a single metal layer of a PCB 800. No VoPs are required, reducing cost in comparison to the arrangement of FIG. 4, at the expense of removal of one IC contact pad and its associated ball/bump from the corresponding CSP 870.

Figure 7A:
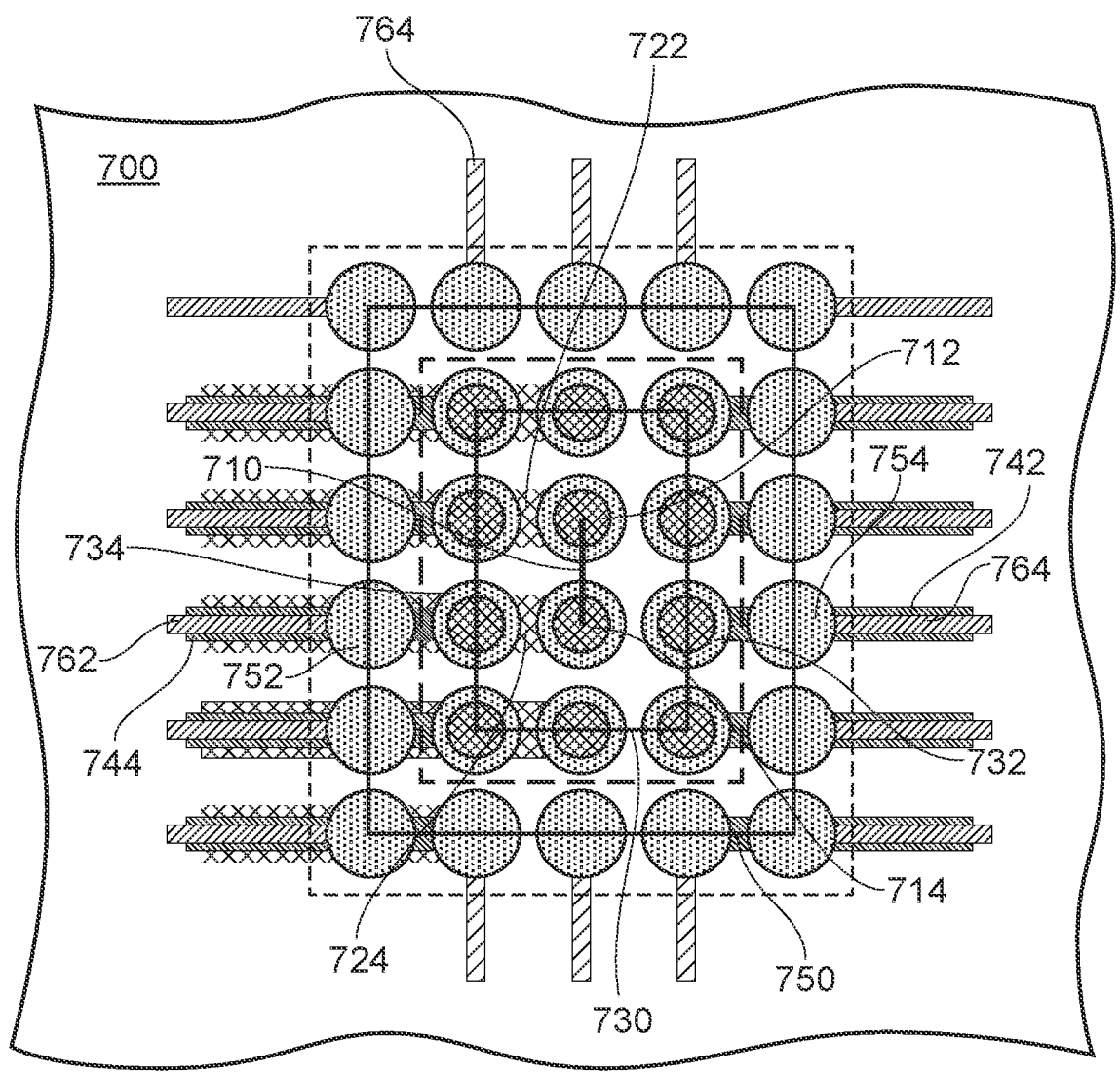
FIG. 7a is a schematic representation of a multilayer PCB having a 6×5 arrangement of PCB contact pads.
Figure 7B:
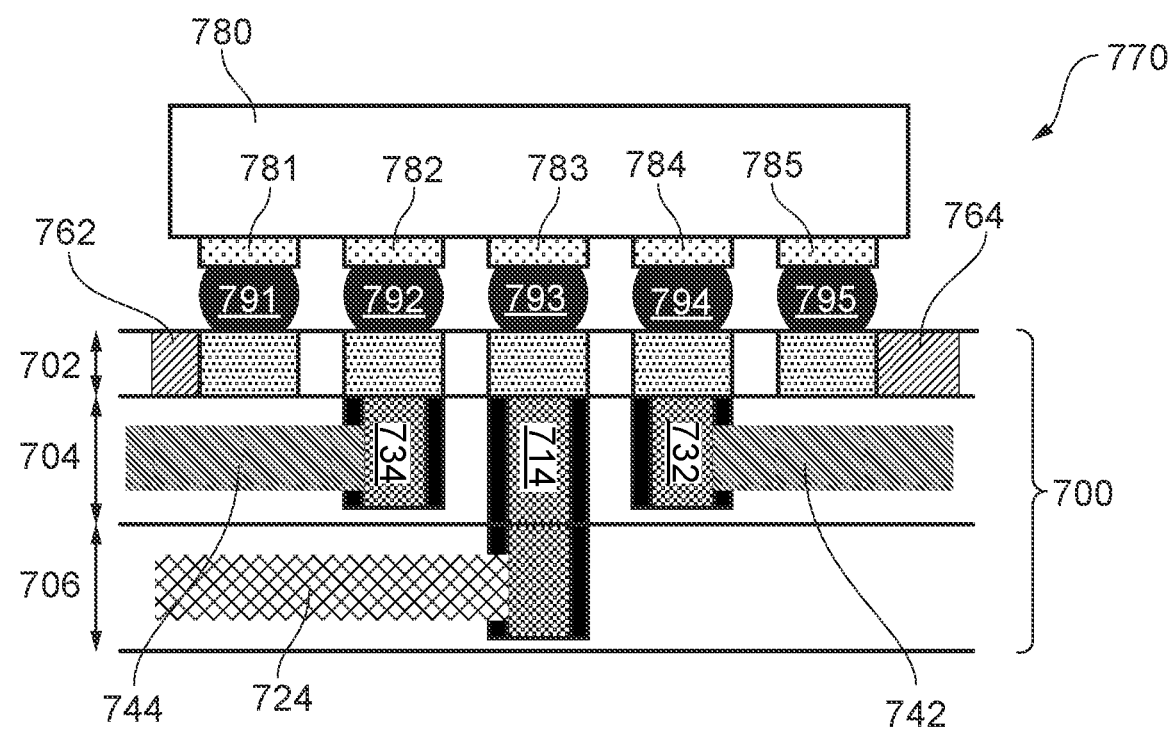
Figure 9A:
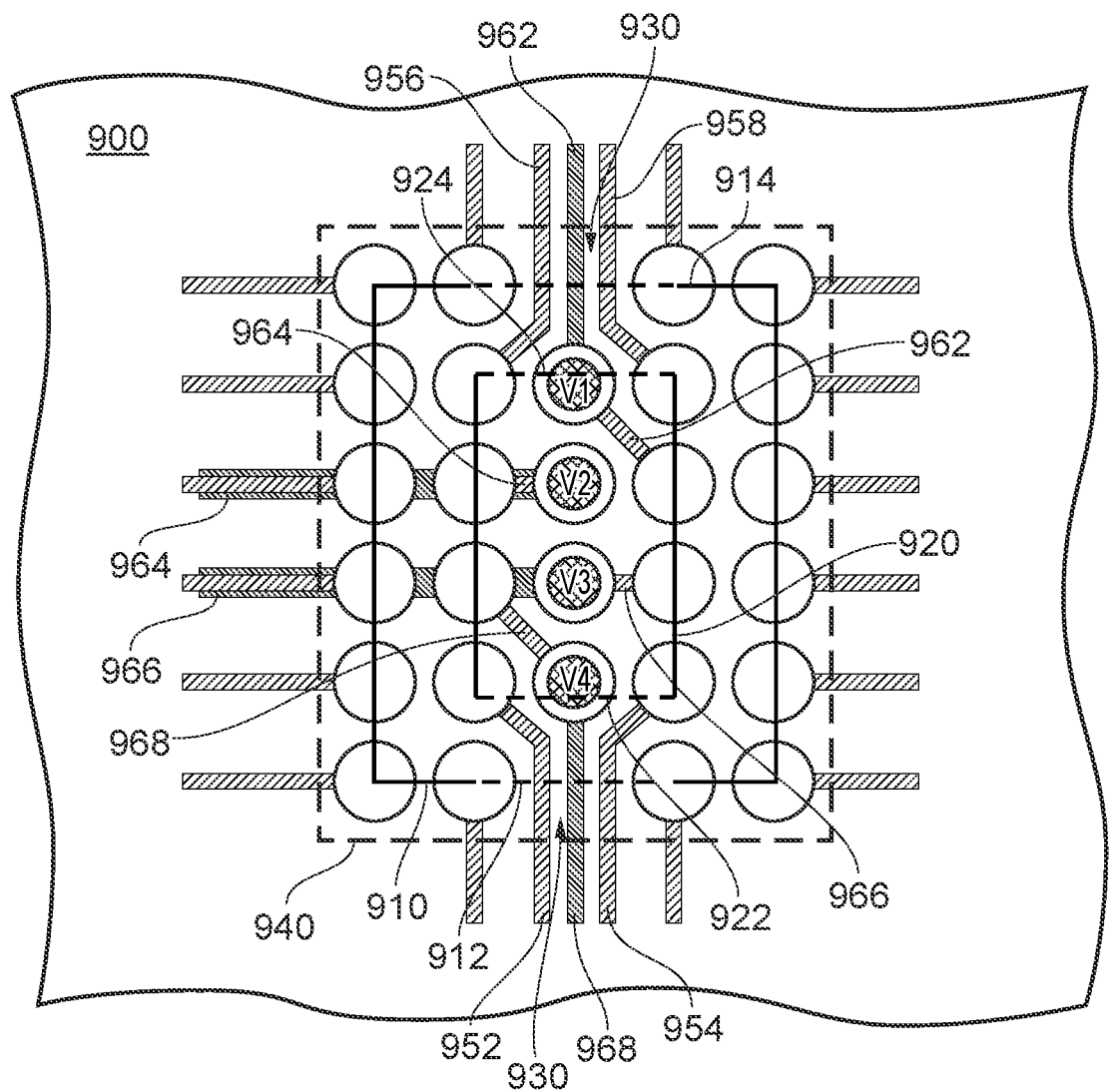
FIG. 9a is a schematic representation of an alternative single-layer PCB having an arrangement of PCB contact pads.

FIG. 9a illustrates a single-layer PCB 900 having an arrangement of PCB contact pads for receiving and electrically coupling to a corresponding arrangement of balls/bumps on a CSP. In comparison to the 5×6 arrangement of FIG. 7a, in the arrangement of FIG. 9a a central column of PCB contact pads has been removed, such that the PCB 900 includes only 24 contact pads, configured as a first discontinuous perimeter/outer "ring", loop or set of 16 PCB contact pads and a second discontinuous "ring", loop or set of 8 PCB contact pads.

The discontinuities 912, 914 and 922, 924 in the respective first and second rings/loops/sets 910, 920 of PCB contact pads provide one or more channel routing regions 930 (in the sense that a single continuous channel routing region may be provided, or a plurality of discrete channel routing regions may be provided) within the outline or footprint 940 of the CSP, for signal routing channels or tracks from the PCB contact pads of the second "ring", loop or set 920 of PCB contact pads.

In this example the width of the channel routing region is equal to 2p−d, where p is the pitch of the PCB contact pads and d is the diameter of the PCB contact pads. Similarly, in this example the width of the gap between PCB contact pads on either side of a discontinuity in the outer ring or loop or a gap between PCB contact pads on either side of a discontinuity in the second ring or loop is equal to 2p−d.

A first set of signal routing channels 952-958 for the PCB contact pads of the second "ring", loop or set 920 are provided in a first metal layer of the PCB 900, extending outwardly through the discontinuities 912, 914 in the first (perimeter/outer) "ring", loop or set 910 of PCB contact pads.

A second set of signal routing channels 962-968 for the PCB contact pads of the second "ring", loop or set 920 extend in the first metal layer within the channel routing region 930 from a respective PCB contact pad to a first end of a respective via V1-V4 that couples the first metal layer to a second metal layer of the PCB 900, and outwardly in the second metal layer from a second end of the respective via V1-V4. Thus in the arrangement of FIG. 9a no VoPs are required to provide signal routing channels or tracks to route signals to or from all of the PCB contact pads of the PCB 900.

Because the vias V1-V4 to the second metal layer are not VoPs, and because the channel routing region 930 is relatively large, the vias V1-V4 can be larger than VoPs, and the tolerances in the width of the signal routing channels 952-958, 962-968 and the size of the vias V1-V4 can be greater than if VoPs were used.

The vias V1-V4 are thus offset from the PCB contact pads to which they are coupled, and may therefore be referred to as "offset vias".

Thus, all of the signal routing channels for the PCB contact pads corresponding to the IC contact pads of the CSP can be provided on the first and second metal layers of a PCB. No VoPs are required, reducing cost in comparison to the arrangement of FIG. 7a, at the expense of removal of one column of IC contact pads and their associated balls/bumps from the corresponding CSP.

Note that the vias in FIG. 9a are not drawn to scale. In a practical implementation the vias may be larger than the PCB contact pads. The channel routing region 930 provided by the discontinuities is large enough to accommodate vias V1-V4 that are larger than the PCB contact pads, which permits the use of less costly tooling and production techniques than are required for PCBs with VoPs.

Figure 9B:
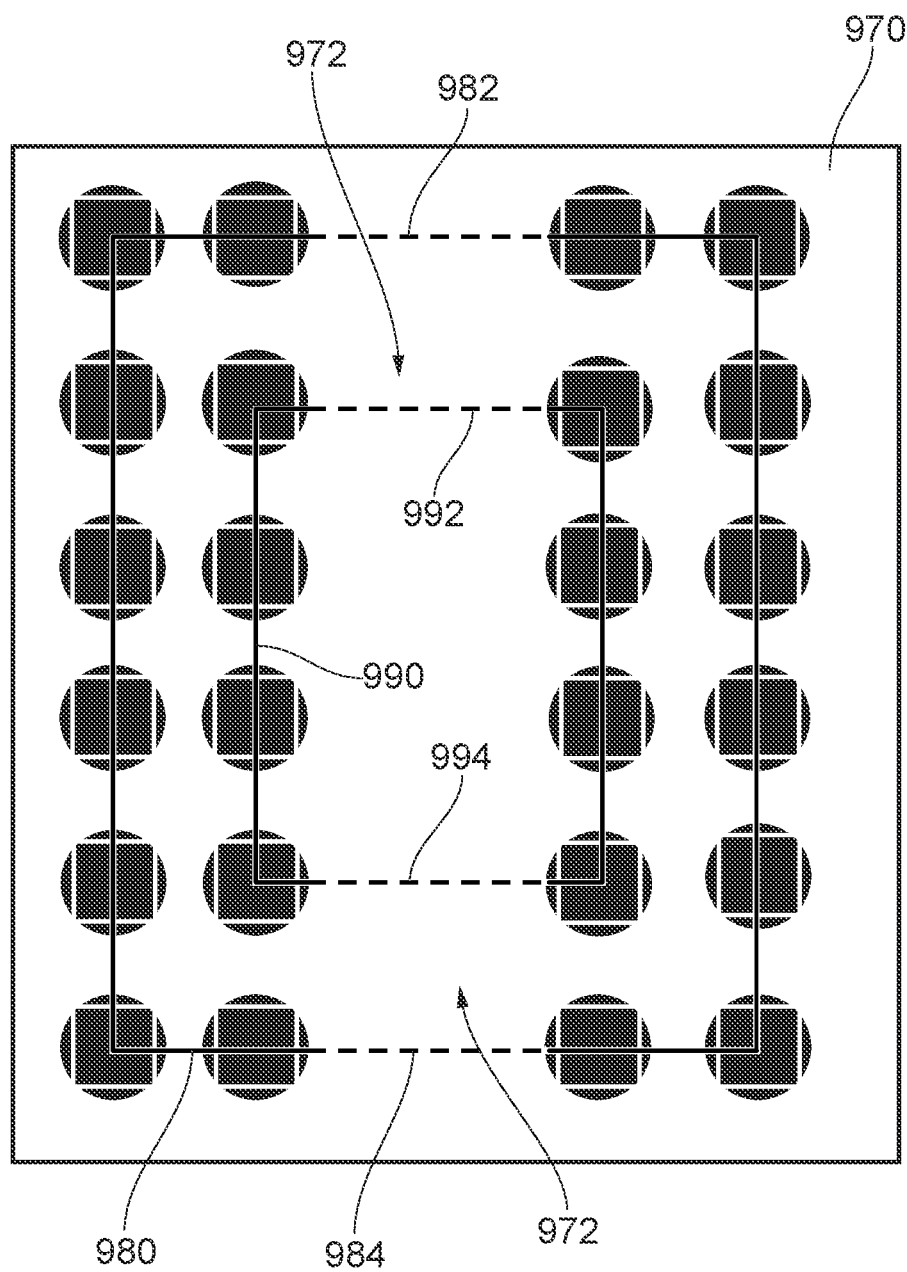

FIG. 9b is a view of the underside of a CSP 970 corresponding to (i.e. for use with) the PCB 900 of FIG. 9a. The CSP 970 comprises 24 IC contact pads and associated balls/bumps, positioned to align with the PCB contact pads of the PCB 900. In comparison with a CSP having a 6×5 arrangement of IC contact pads and associated balls/bumps, in the CSP 970 one column of IC contact pads and their associated balls/bumps have been removed, such that the CSP 970 has a discontinuous first (outer/perimeter) ring/loop/set 980 of 16 IC contacts and associated balls/bumps, and a discontinuous second (inner) ring/loop/set 990 of 8 IC contacts and associated balls/pads. Discontinuities 982, 984 in the first ring/loop/set 980 and discontinuities 992, 994 in the second ring/loop/set 990 provide one or more channel routing regions 972 (in the sense that a single continuous channel routing region may be provided, or a plurality of discrete channel routing regions may be provided) within the outline/footprint of the CSP 970 for signal routing channels/tracks on the PCB 900 for the balls/bumps of the second ring/loop/set 990. Note that the pitch and clearance of the balls/bumps is the same as in a 6×5 CSP arrangement.

Figure 10A:
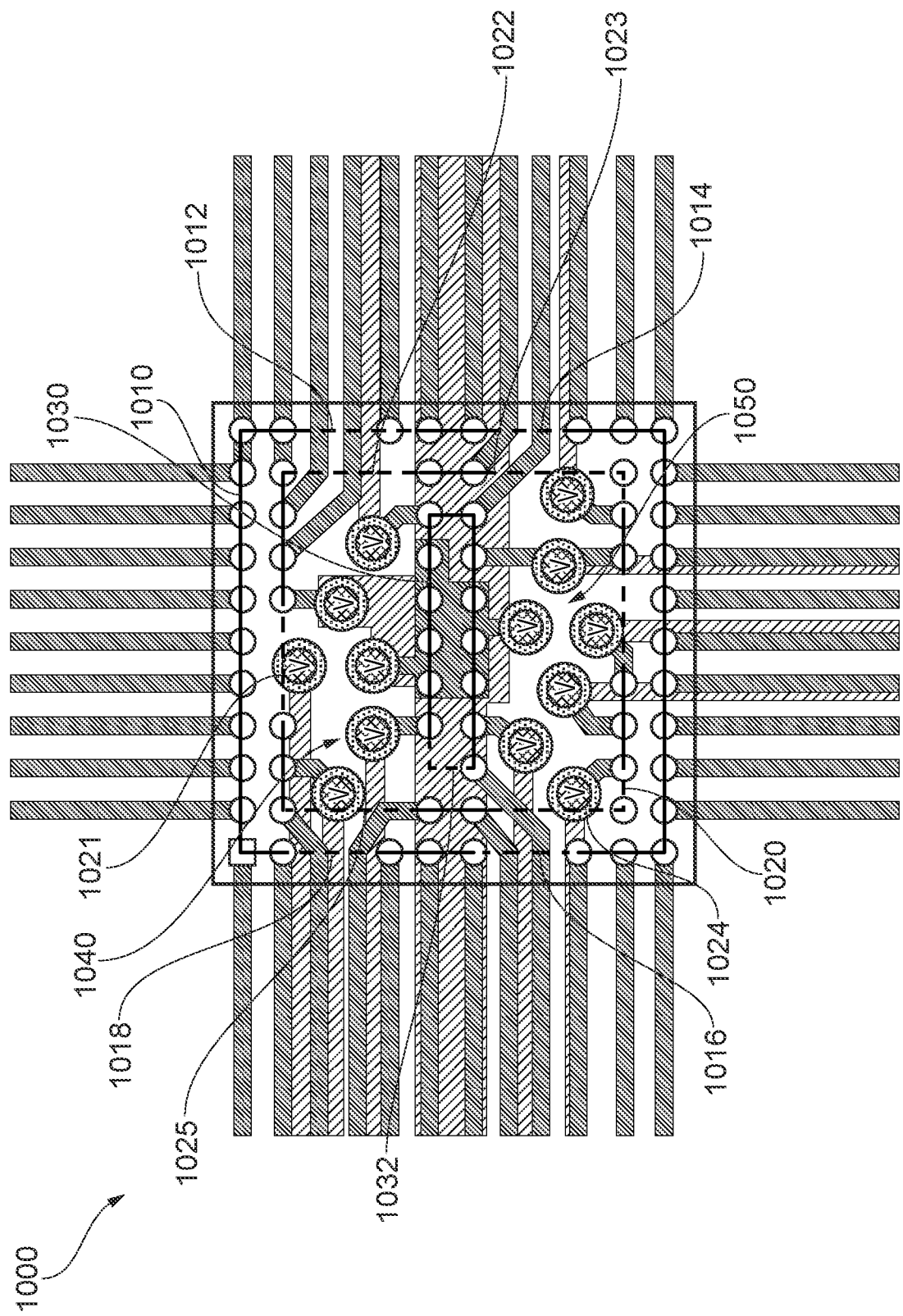
FIG. 10a is a schematic representation of an alternative single-layer PCB having an arrangement of PCB contact pads.

FIG. 10a illustrates a single-layer PCB 1000 having an arrangement of PCB contact pads for receiving and electrically coupling to a corresponding arrangement of balls/bumps on a CSP.

As can be seen, the PCB 1000 has a discontinuous first (perimeter/outer) "ring", loop or set 1010 of 34 PCB contact pads, a discontinuous second (intermediate) "ring", loop or set 1020 of 16 PCB contact pads, and a discontinuous third (inner/central) "ring", loop or set 1030 of 13 PCB contact pads.

In this example, discontinuities 1012-1018, 1021-1025, 1032 in the respective first, second and third rings/loops/sets 1010, 1020, 1030 of PCB contact pads provide two channel routing regions 1040, 1050, within the outline or footprint of the CSP, for signal routing channels or tracks from PCB contact pads of the second "ring"/loop/set 1020 of PCB contact pads.

A first set of signal routing channels or tracks for the PCB contact pads of the second "ring"/loop/set 1020 are provided in a first metal layer of the PCB 1000, extending outwardly through the discontinuities 1012-1018 in the perimeter/outer "ring"/loop/set 1010 of PCB contact pads.

A second set of signal routing channels or tracks for the PCB contact pads of the second "ring"/loop/set 1020 extend in the first metal layer within the channel routing regions from respective PCB contact pads to first ends of respective vias (denoted V in FIG. 10*a*). Each via V couples a portion of a signal routing channel or track of the second set provided in the first metal layer to a portion of that signal routing channel or track of the second set provided in a second metal layer of the PCB, such that each signal routing channel or track of the second set extends outwardly in the second metal layer from a second end of the via. No VoPs are required. Because the vias to the second metal layer are not VoPs, and because the channel routing regions 1040, 1050 are relatively large, the vias V can be larger than VoPs, and the tolerances in the width of the signal routing channels and the size of the vias can be greater.

Thus, all of the signal routing channels for the PCB contact pads corresponding to the IC contact pads of the CSP can be provided on the first and second metal layers of a PCB. No VoPs are required to provide signal routing channels or tracks for routing signals to or from all of the PCB contact pads of the PCB 1000.

Figure 10B:
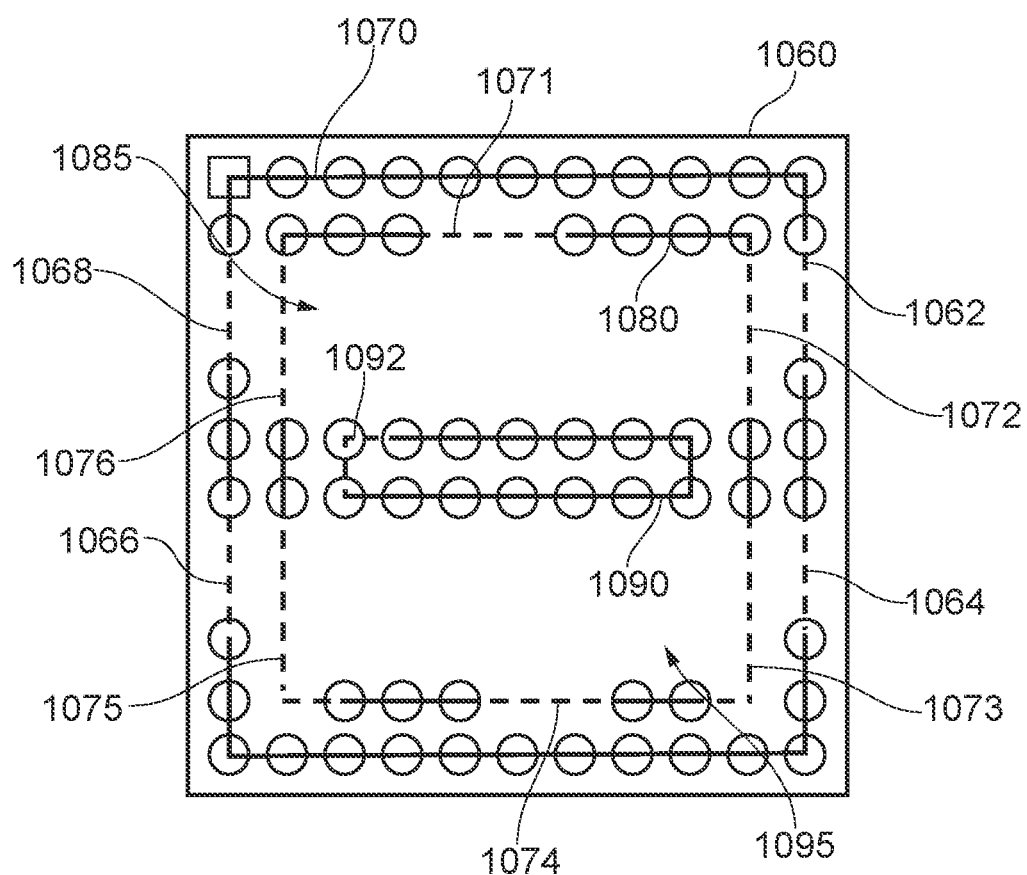

FIG. 10*b* is a view of the underside of a CSP 1060 corresponding to (i.e. for use with) the PCB 1000 of FIG. 10*a*. The CSP 1060 comprises 63 IC contact pads and associated balls/bumps, positioned to align with the PCB contact pads of the corresponding PCB 1000 arrangement shown in FIG. 10*a*.

The CSP 1060 has a discontinuous first (outer/perimeter) ring/loop/set 1070 of 34 IC contacts and associated balls/bumps, a discontinuous second (intermediate) "ring"/loop/set 1080 of 16 IC contacts and associated balls/pads, and a discontinuous third (inner/central) "ring"/loop/set 1090 of IC contacts and associated balls/pads.

Discontinuities 1062-1068, 1071-1076, 1092 in the first, second and third rings/loops/sets 1070, 1080, 1090 of IC contacts and associated balls/bumps (in combination, in this example, with regions that are devoid of any IC contacts and associated balls/bumps), provide first and second channel routing regions 1085, 1095 within the outline/footprint of the CSP 1060 for signal routing channels/tracks on the PCB for the balls/bumps of the second "ring"/loop/set.

For arrangements such as those illustrated in FIGS. 8*a*-10*b* it can be advantageous to use the finest ball/bump pitch possible, to increase the number of PCB contact pads in the outer/perimeter ring/loop/set and to maximise flexibility for placement of vias.

In some of the accompanying Figures, IC contact pads are shown as being square, to enable them to be clearly distinguished from the contact balls/pads to which they couple. However, those of ordinary skill in the art will readily appreciate that the IC contact pads in a practical implementation are typically round or circular to correspond to the shape and/or size of the contact ball/bump (though other shapes, e.g. polygons, may also be used). Thus it is to be understood that the present disclosure is not limited to IC contact pads that are square, but extends to IC contact pads of any shape.

Figure 11B:
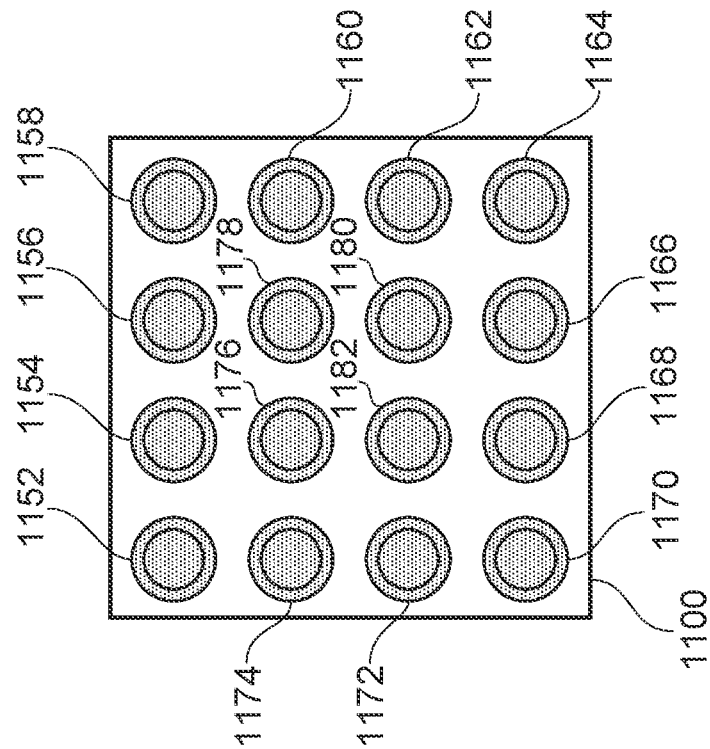
Figure 11A:
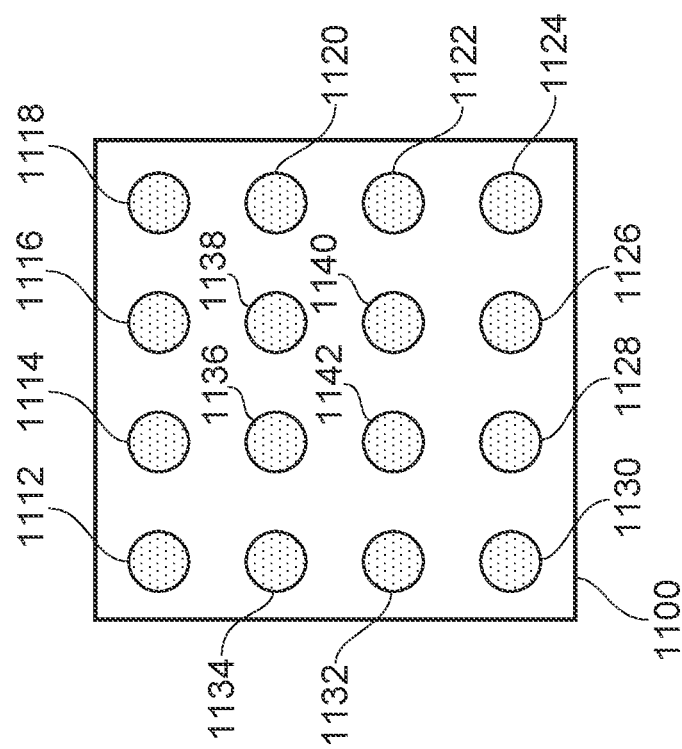
FIG. 11a is a schematic illustration of the underside of an IC die, showing generally circular IC contact pads.

FIG. 11*a* is a schematic illustration of the underside of an IC die 1100, showing generally circular IC contact pads 1112-1142. FIG. 11*b* shows contact balls/bumps 1152-1174 disposed on the IC contact pads of the same IC die 1100 (though for clarity the IC contact pads 1112-1142 are not labelled in FIG. 11*b*).

In the FIGS. 1-11*b*, IC contact pads and their associated balls/bumps, and the corresponding PCB contact pads, are shown as being arranged in aligned rows and columns.

For example, in FIG. 9*a* the PCB contact pads of the second ring, loop or set 920 are shown as being horizontally aligned with the PCB contact pads of the first ring, loop or set 910.

Similarly, in FIG. 9*b* the IC contact pads (and their associated balls/bumps) of the second ring, loop or set 990 are shown as being horizontally aligned with the IC contact pads (and their associated balls/bumps) of the first ring, loop or set 980.

However, in other arrangements the IC contact pads of the first set (and their associated balls/bumps), and the IC contact pads of the second set (and their associated balls/bumps) may be offset from each other, e.g. by approximately half the diameter of a ball/bump. The corresponding PCB contact pads may be similarly offset.

Figures 12A, 12B:
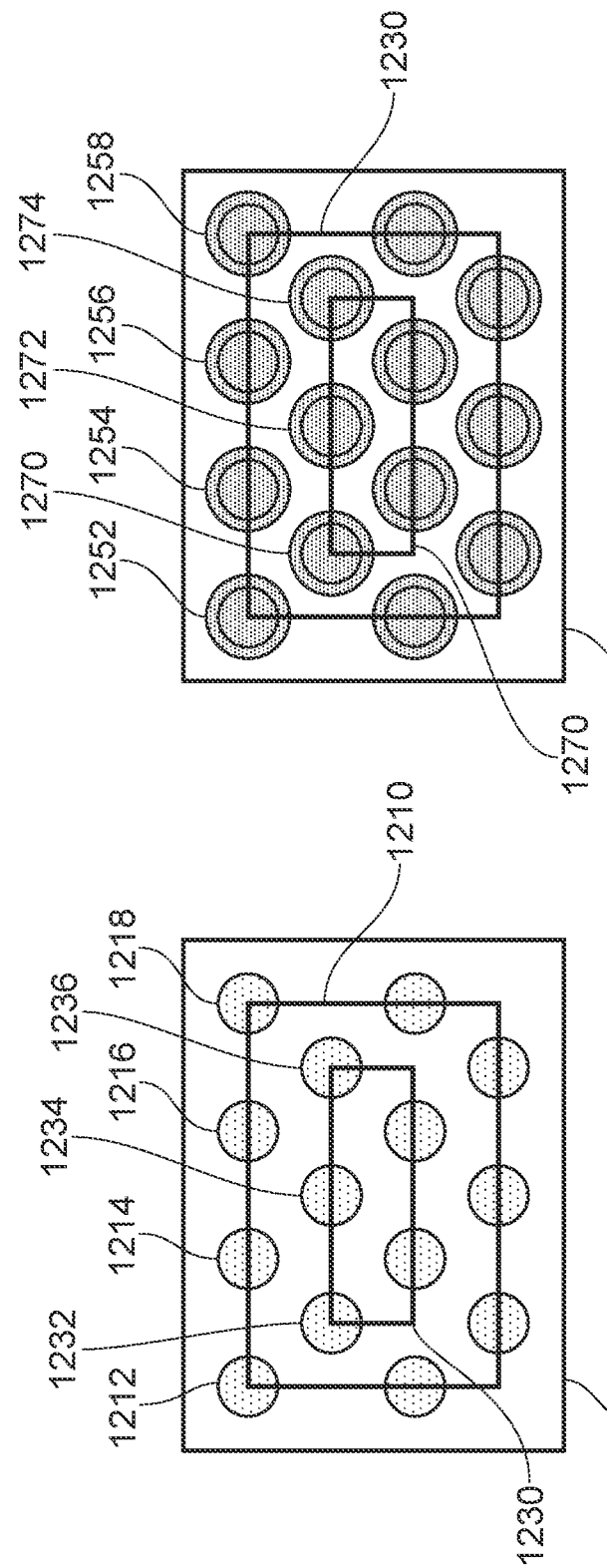

FIG. 12*a* is a schematic illustration of the underside of a CSP 1200, showing generally circular IC contact pads arranged in a first set 1210 and a second set 1230. As can be seen, the IC contact pads 1232-1236 of the second set 1230 are laterally (horizontally) offset from the IC contact pads 1212-1216 of the first set 1210.

FIG. 12*b* shows contact balls/bumps disposed on the IC contact pads of the CSP 1200 in a first set 1250 and a second set 1270. As can be seen, the balls/bumps 1272-1276 of the second set 1270 are laterally (horizontally) from the balls/bumps 1252-1256 of the first set 1250.

By offsetting adjacent sets of contact pads of the IC, the distance between adjacent sets of contact pads can be reduced, thus allowing a reduction in the area occupied by given number of contact pads and their associated balls/pads. In this way the total area or footprint of the CSP can be reduced.

Figure 13A:
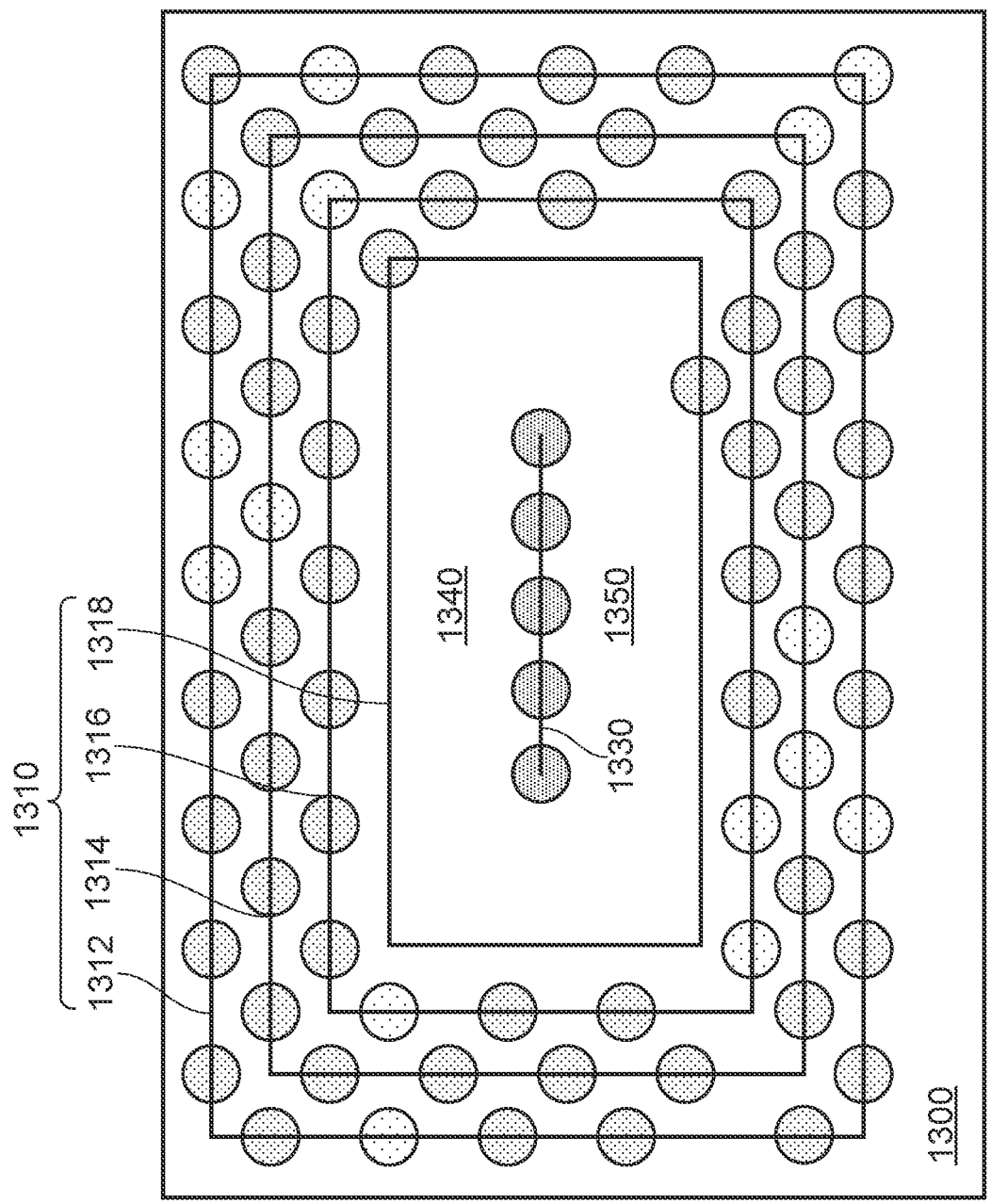
FIG. 13a is a schematic illustration of the underside of a CSP having offset balls/bumps and channel routing regions.

FIG. 13*a* is a schematic illustration of the underside of a CSP 1300 having offset balls/bumps and channel routing regions.

As can be seen, the CSP 1300 includes a first (outer or perimeter) ring, loop or set 1310 of balls/bumps which in this example comprises first, second and third concentric rings or loops 1312, 1314, 1316 of balls/bumps and a fourth partial ring or loop 1318, concentric with the first, second and third rings or loops 1312, 1314, 1316, containing, in this example, two balls/bumps.

The CSP 1300 further includes a second (inner or central) "ring", loop or set 1330 of balls/bumps, which in this example comprises a row of five balls/bumps.

Disposed between the first set of balls/bumps 1310 and the second set of balls/bumps 1330 are first and second channel routing regions 1340, 1350. The first and second channel routing regions 1340, 1350 are devoid of any balls/bumps, and provide regions within the outline/footprint of the CSP 1300 for accommodating signal routing channels/tracks on a corresponding PCB for the balls/bumps of the second "ring"/set 1330.

FIG. 13*b* is a schematic illustration of a PCB arrangement configured to receive the CSP 1300 of FIG. 13*a*.

The PCB arrangement, shown generally at 1350, includes a first (outer or perimeter) ring, loop or set 1360 of PCB contact pads, corresponding to the first ring, loop or set 1310 of balls/bumps of the CSP 1300. Thus in this example the first ring, loop or set 1360 of PCB contact pads comprises first, second and third concentric rings or loops 1362, 1364, 1366 of PCB contact pads, and two additional PCB contact pads corresponding to the two balls/bumps of the fourth partial ring or loop 1318 of the CSP 1300.

As shown in FIG. 13*b*, the PCB contact pads of the second concentric ring or loop 1364 are offset with respect to the PCB contact pads of the first concentric ring or loop 1362.

Similarly, the PCB contact pads of the third concentric ring or loop 1366 are offset with respect to the PCB contact pads of the second concentric ring or loop 1364.

This offset arrangement of the PCB contact pads facilitates routing of signals to and from the PCB contact pads of the second concentric ring or loop 1364, as signal routing channels or tracks can extend through spaces or gaps between adjacent PCB contact pads of the first concentric ring or loop 1362 to reach the PCB contact pads of the second concentric ring or loop 1364.

The PCB arrangement 1350 further includes a second (inner or central) "ring", loop or set 1370 of PCB contact pads, corresponding to the second ring, loop or set 1330 of balls/bumps of the CSP 1300. Thus in this example the second "ring", loop or set 1370 of PCB contact pads comprises a row of five PCB contact pads.

A first set of signal routing channels or tracks for the PCB contact pads of the first (perimeter/outer) ring/loop/set 1360 of PCB contact pads is provided in a first metal layer of the PCB arrangement 1350. Each signal routing channel of the first set is coupled to a respective one of the PCB contact pads of the first concentric ring or loop 1362.

For example, a PCB contact pad 1362-1 belonging to the first ring or loop 1362 of the first set 1360 is coupled to a first signal routing channel or track 1368-1 provided in the first metal layer of the PCB arrangement 1350.

A second set of signal routing channels or tracks for the PCB contact pads of the first (perimeter/outer) ring/loop/set 1360 of PCB contact pads is provided in a first metal layer of the PCB arrangement 1350. Each signal routing channel of the second set is coupled to a respective one of the PCB contact pads of the second concentric ring 1364.

For example, a PCB contact pad 1364-1 belonging to the second concentric ring or loop 1366 of the first set 1360 is coupled to a first signal routing channel or track 1368-2 provided in the first metal layer of the PCB arrangement 1350.

As will be apparent from FIG. 13*b*, the signal routing channels or tracks of the second set, which couple to PCB contact pads of the second concentric ring or loop 1364 of the first set 1360 (e.g. signal routing channel or track 1368-2 which coupled to PCB contact pad 1364-1) extend through a space or gap between adjacent contact pads of the first concentric ring or loop 1362. This is possible because of the offset arrangement of the PCB contact pads of the concentric rings or loops 1362, 1364, 1366 of the first set of PCB contact pads 1360.

Disposed between the first and second sets of PCB contact pads 1360, 1370 are first and second channel routing regions 1380, 1390. In this example the channel routing regions include vias (denoted V in FIG. 13*b*), some of which are coupled, by signal routing channels or tracks in a first metal layer of the PCB arrangement 1350, to PCB contact pads of the third concentric ring or loop 1366.

For example, a first end of a via 1382 is coupled by a signal routing channel or track 1368-3 in the first metal layer of the PCB arrangement 1350 to a PCB contact pad 1366-1 belonging to the third concentric ring 1366. A second end of the via 1382 is coupled to a signal routing channel or track 1386 in a second metal layer of the PCB arrangement 1350.

Thus signals can be routed to and from the PCB contact pads of the third concentric ring or loop 1366 without using VoPs. As in the PCB arrangement of FIG. 10*a*, because the vias to the second metal layer are not VoPs, and because the channel routing regions 1380, 1390 are relatively large, the vias V can be larger than VoPs, and the tolerances in the width of the signal routing channels and the size of the vias can be greater than if VoPs were used.

As will be apparent from the discussion above, in the PCB arrangement 1350 of FIG. 13*b*, all of the signal routing channels for the PCB contact pads corresponding to the IC contact pads and the associated balls/bumps of the CSP 1300 can be provided on the first and second metal layers of a PCB. Thus, a relatively inexpensive two-layer PCB substrate can be used. Additionally, because no VoPs are required, less costly tooling and production techniques than are required for PCBs with VoPs can be used. Thus, significant cost savings can be made in the manufacture of the PCB arrangement.

Figure 14A:
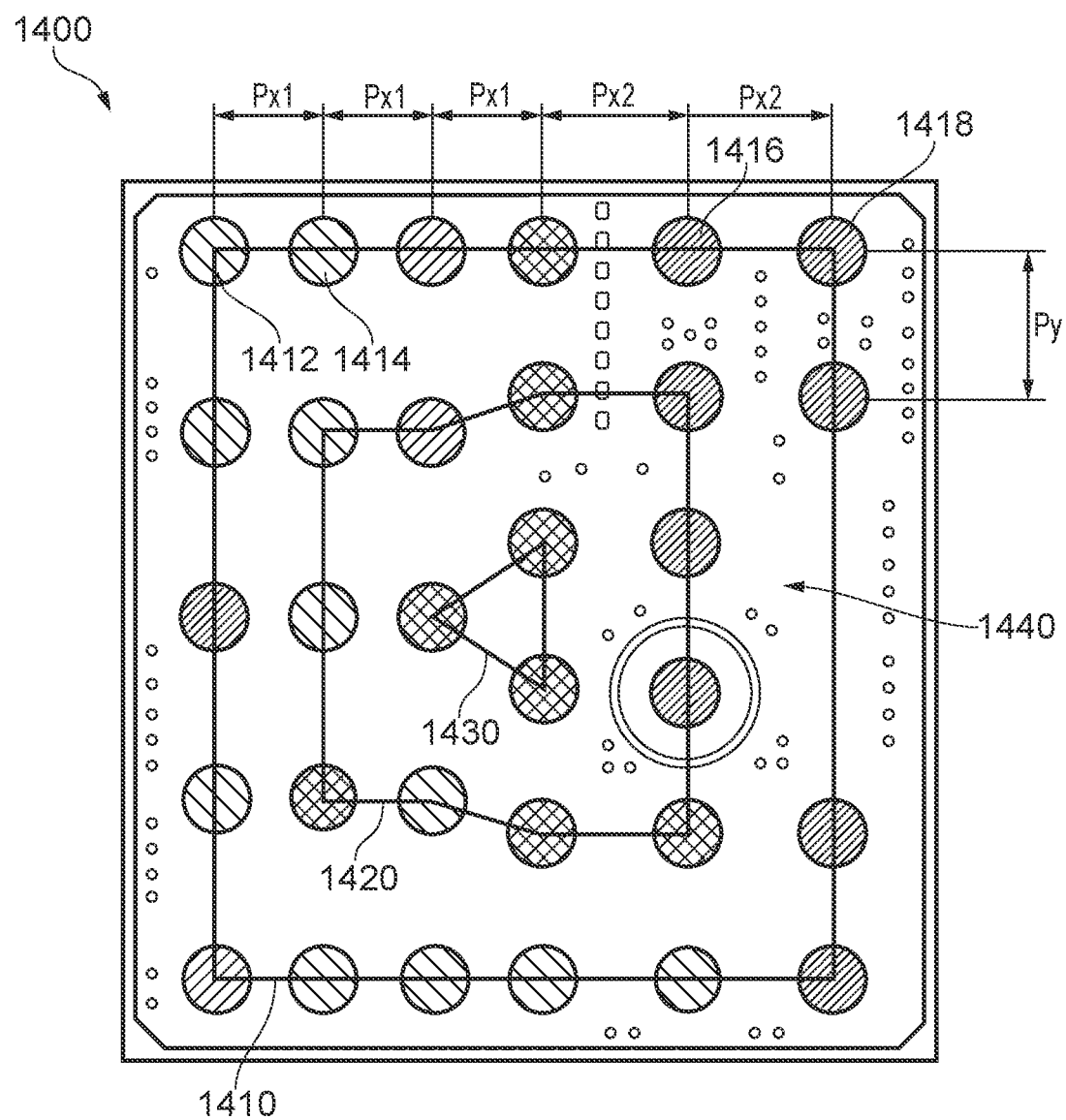
FIG. 14a is a schematic illustration of the underside of a CSP having mixed-pitch balls/bumps and channel routing regions.

FIG. 14*a* is a schematic illustration of the underside of a CSP 1400 having mixed-pitch balls/bumps and channel routing regions.

As can be seen, the CSP 1400 includes a first (outer or perimeter) ring, loop or set 1410 of balls/bumps. The CSP 1400 further includes a second (intermediate) ring, loop or set 1420 of balls/bumps. The CSP 1400 further includes a third (inner or central) ring, loop or set 1430 of balls/bumps.

The first ring or loop 1410 of balls/bumps includes a discontinuity 1412, which provides or forms part of a channel routing region 1440 devoid of any balls/bumps, within the footprint or outline of the CSP 1400, for one or more signal routing channels or tracks provided in a metal layer of a PCB to which the CSP 1400 is mounted, to facilitate routing of signals to and from the balls/bumps of the second ring or loop 1420.

In the example illustrated in FIG. 14*a*, the pitch of the balls/bumps is not uniform. A vertical pitch Py of the balls/bumps is uniform, and may be, for example, 0.4 mm. However, a horizontal pitch of the bumps is non-uniform. A first horizontal pitch Px1, e.g. of balls/bumps 1412, 1414 may be, for example, 0.3 mm, whereas a second horizontal pitch Px2, e.g. of balls/bumps 1416, 1418, may be greater, for example, 0.4 mm.

The variable pitch of the balls/pads of the CSP 1400 may facilitate routing of signals to or from the balls/bumps of the second and third rings or loops 1420, 1430, as signal routing channels or tracks provided in a metal layer of a PCB to which the CSP 1400 is mounted may be able to extend between adjacent balls/bumps of the CSP 1400 having the second pitch.

Figure 14B:
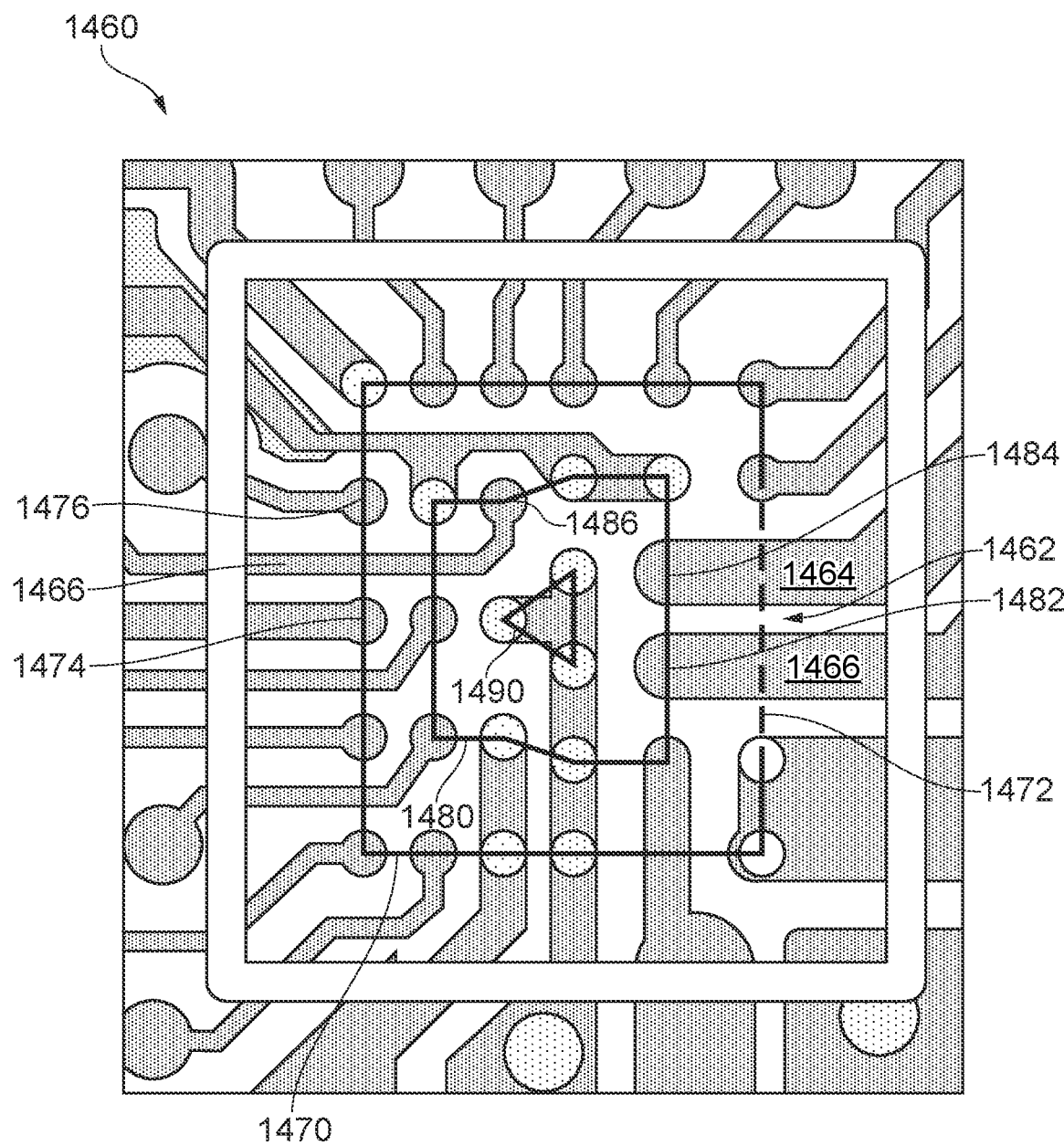

FIG. 14*b* is a schematic illustration of a PCB arrangement configured to receive the CSP 1300 of FIG. 14*a*.

The PCB arrangement, shown generally at 1460, includes a first (outer or perimeter) ring, loop or set 1470 of PCB contact pads, corresponding to the first ring, loop or set 1410 of balls/bumps of the CSP 1400.

The PCB arrangement 1460 further includes a second (intermediate) "ring", loop or set 1480 of PCB contact pads corresponding to the second ring, loop or set 1420 of balls/bumps of the CSP 1400, and a third (inner or central) "ring", loop or set 1490 of PCB contact pads corresponding to the third "ring", loop or set 1430 of balls/bumps of the CSP 1400. Thus, when the CSP 1400 is mounted on the PCB 1460 the bumps/balls of each of the first, second and third sets 1410-1430 of balls/bumps will couple with the corresponding PCB contact pads of the respective first, second and third sets of PCB contact pads of the PCB 1460.

A first set of signal routing channels or tracks for the PCB contact pads of the first (perimeter/outer) ring/loop/set 1470 of PCB contact pads is provided in a first metal layer of the PCB arrangement 1460. Each signal routing channel of the first set is coupled to a respective one of the PCB contact pads of the first ring/loop/set 1470.

A second set of signal routing channels or tracks for the PCB contact pads of the second (intermediate) ring/loop/set 1480 of PCB contact pads is provided in the first metal layer of the PCB arrangement 1460. Each signal routing channel of the second set is coupled to a respective one of the PCB contact pads of the second ring/loop/set 1480. As can be seen in FIG. 14*b*, a discontinuity 1472 in the first (perimeter/outer) ring/loop/set of PCB contact pads 1470 provides a channel routing region 1462 for signal routing channels or tracks 1464, 1466 that couple to PCB contact pads 1482, 1484 of the second set 1480.

Additionally, signal routing channels or tracks of the second set extend through gaps or spaces between vertically adjacent PCB contact pads of the first set 1470 to couple to PCB contact pads of the second set 1480. For example, a signal routing channel or track 1466 of the second set extends through a space between vertically adjacent PCB contact pads 1474, 1476 to couple to a PCB contact pad 1486 of the second set 1480.

Thus in the example illustrated in FIGS. 14*a* and 14*b*, the combination of the channel routing region 1440 and the mixed pitch of the balls/bumps of the CSP 1400 facilitates the coupling of signal routing channels or tracks to the PCB contact pads of the second set 1480 without requiring the use of any vias. Thus a low-cost single layer PCB can be used for the PCB arrangement 1460.

As will be appreciated by those of ordinary skill in the art, the provision of channel routing regions in CSPs and corresponding PCBs as described herein permits the use of simple and inexpensive PCB technology for mounting the CSPs, thus reducing the cost and complexity of manufacture of the PCB and thus of a device incorporating the PCB and the corresponding CSP.

It should be understood—especially by those having ordinary skill in the art with the benefit of this disclosure—that the various operations described herein, particularly in connection with the figures, may be implemented by other circuitry or other hardware components. The order in which each operation of a given method is performed may be changed, and various elements of the systems illustrated herein may be added, reordered, combined, omitted, modified, etc. It is intended that this disclosure embrace all such modifications and changes and, accordingly, the above description should be regarded in an illustrative rather than a restrictive sense.

Similarly, although this disclosure makes reference to specific embodiments, certain modifications and changes can be made to those embodiments without departing from the scope and coverage of this disclosure. Moreover, any benefits, advantages, or solutions to problems that are described herein with regard to specific embodiments are not intended to be construed as a critical, required, or essential feature or element. Further embodiments likewise, with the benefit of this disclosure, will be apparent to those having ordinary skill in the art, and such embodiments should be deemed as being encompassed herein.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

The invention claimed is:

1. A chip scale package (CSP) comprising:
 a semiconductor die;
 a first set of CSP contact balls or bumps comprising a discontinuous first ring or loop of CSP contact balls or bumps;
 a second set of CSP contact balls or bumps, wherein the first and second sets of CSP contact balls or bumps are coupled to the semiconductor die and are positioned within a perimeter of the semiconductor die; and
 a channel routing region, the channel routing region being devoid of any CSP contact balls or bumps;
 wherein the first and second sets of CSP contact balls or bumps are configured for directly mounting the CSP on, and electrically coupling the CSP to, a substrate of a host device incorporating the CSP, and the CSP is approximately the same size as the semiconductor die; and
 wherein the channel routing region is provided, at least in part, by a discontinuity in the first ring or loop.

2. A CSP according to claim 1, wherein the channel routing region is intermediate the first and second sets of CSP contact balls or bumps.

3. A CSP according to claim 1, wherein the second set of CSP contact balls or bumps comprises a second ring or loop of CSP contact balls or bumps.

4. A CSP according to claim 3, wherein the second ring or loop of CSP contact balls or bumps is discontinuous, and wherein the channel routing region is provided, at least in part, by a discontinuity in the second ring or loop.

5. A CSP according to claim 1, wherein the CSP contact balls or bumps of the second set are offset with respect to the CSP contact balls or bumps of the first set.

6. A CSP according to claim 1, wherein a pitch of the CSP contact balls or bumps of the first set or the second set is non-uniform.

7. A substrate arrangement for receiving a CSP according to claim 1, the substrate arrangement comprising:
 a first set of substrate contact pads configured to receive the first set of CSP contact balls or bumps;
 a second set of substrate contact pads configured to receive the second set of CSP contact balls or bumps; and
 a channel routing region, the channel routing region comprising one or more signal routing channels in a first metal layer of the substrate.

8. A substrate arrangement according to claim 7, wherein the channel routing region is intermediate the first and second sets of substrate contact pads.

9. A substrate arrangement according to claim 7, wherein the substrate comprises a second metal layer.

10. A substrate arrangement according to claim 9, wherein the channel routing region comprises a via configured to electrically couple the first metal layer to the second metal layer.

11. A substrate arrangement according to claim 10, wherein the via is coupled at a first end to a substrate contact pad by a signal routing channel in the first metal layer, and at a second end to a signal routing channel in the second metal layer.

* * * * *